(12) United States Patent
Moriwaki

(10) Patent No.: US 11,257,826 B2
(45) Date of Patent: Feb. 22, 2022

(54) SEMICONDUCTOR INTEGRATED CIRCUIT DEVICE

(71) Applicant: SOCIONEXT INC., Kanagawa (JP)

(72) Inventor: Shinichi Moriwaki, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 65 days.

(21) Appl. No.: 16/986,835

(22) Filed: Aug. 6, 2020

(65) Prior Publication Data

US 2020/0365603 A1    Nov. 19, 2020

Related U.S. Application Data

(63) Continuation of application No. PCT/JP2018/004252, filed on Feb. 7, 2018.

(51) Int. Cl.
*H01L 27/11* (2006.01)
*H01L 23/528* (2006.01)
*H01L 23/522* (2006.01)

(52) U.S. Cl.
CPC ........ *H01L 27/1108* (2013.01); *H01L 23/528* (2013.01); *H01L 23/5226* (2013.01)

(58) Field of Classification Search
None
See application file for complete search history.

(56) References Cited

U.S. PATENT DOCUMENTS

| 9,558,809 B1 | 1/2017 | Liaw |
| 2010/0219483 A1 | 9/2010 | Masuoka et al. |
| 2013/0258759 A1* | 10/2013 | Liaw ..................... G06F 30/394 |
| | | 365/154 |
| 2015/0318288 A1* | 11/2015 | Lim ..................... H01L 29/7827 |
| | | 257/329 |
| 2016/0078922 A1* | 3/2016 | Liaw ................... H01L 27/0207 |
| | | 365/51 |
| 2017/0179134 A1* | 6/2017 | Liaw ................... H01L 29/1095 |
| 2617/0179134 | 6/2017 | Liaw |

FOREIGN PATENT DOCUMENTS

WO    2009/095998 A1    8/2009

OTHER PUBLICATIONS

International Search Report issued in corresponding International Patent Application No. PCT/JP2018/004252, dated Apr. 10, 2018, With English translation.
Written Opinion issued in corresponding International Patent Application No. PCT/JP2018/004252, dated Apr. 10, 2018, with partial English translation.

* cited by examiner

*Primary Examiner* — Khaja Ahmad
(74) *Attorney, Agent, or Firm* — McDermott Will and Emery LLP

(57) ABSTRACT

A static random access memory (SRAM) cell has first to sixth transistors that are vertical nanowire (VNW) FETs. The second and fifth transistors are placed side by side sequentially on one side in the X direction of the first transistor. The fourth and sixth transistors are placed side by side sequentially on the other side in the X direction of the third transistor. The first and third transistors are placed side by side in the Y direction.

5 Claims, 25 Drawing Sheets

SEMICONDUCTOR INTEGRATED CIRCUIT DEVICE

CROSS-REFERENCE TO RELATED APPLICATIONS

This is a continuation of International Application No. PCT/JP2018/004252 filed on Feb. 7, 2018. The entire disclosure of this application is incorporated by reference herein.

BACKGROUND

The present disclosure relates to a semiconductor integrated circuit device provided with vertical nanowire (VNW) field effect transistors (FETs), and more particularly to a memory cell layout structure of static random access memory (SRAM).

Regarding transistors as basic constituents of an LSI, improvement in integration degree, reduction in operating voltage, and improvement in operating speed have been achieved thanks to the scaling of the gate length. Recently, however, an increase in off current due to excessive scaling and the resulting significant increase in power consumption have become a problem. To solve this problem, three-dimensional transistors having a three-dimensional structure changed from the conventional planar structure have been vigorously studied. As one type of such transistors, a vertical nanowire FET (hereinafter referred to as a VNW FET as appropriate) has attracted attention.

U.S. Unexamined Patent Application Publication No. 2016/0078922 (FIG. 5) and U.S. Pat. No. 9,558,809 (FIG. 10A) disclose layouts of SRAM cells using VNW FETs.

SUMMARY

In the layouts disclosed in the above patent documents, the arrangement of transistors constituting an SRAM cell is not symmetric. An asymmetric property therefore arises in device characteristics, and this becomes a cause of problems such as deterioration in device characteristics, reduction in reliability, and reduction in yield.

An objective of the present disclosure is providing a layout structure of an SRAM cell using VNW FETs that has a highly symmetric transistor arrangement and a reduced area.

In the first mode of the present disclosure, in a semiconductor integrated circuit device provided with a static random access memory (SRAM) cell, the SRAM cell includes a first memory node, a second memory node, a first transistor of a first conductivity type provided between a high voltage-side power supply line and the first memory node, a second transistor of a second conductivity type provided between a low voltage-side power supply line and the first memory node, a third transistor of the first conductivity type provided between the high voltage-side power supply line and the second memory node, a fourth transistor of the second conductivity type provided between the low voltage-side power supply line and the second memory node, a fifth transistor of the second conductivity type provided between a bit line and the first memory node, a gate of the fifth transistor being connected with a word line, and a sixth transistor of the second conductivity type provided between an inverted bit line and the second memory node, a gate of the sixth transistor being connected with the word line, gates of the first and second transistors are mutually connected and also connected with the second memory node, gates of the third and fourth transistors are mutually connected and also connected with the first memory node, the first to sixth transistors are vertical nanowire (VNW) FETs, the second and fifth transistors are placed side by side sequentially on a first-hand side in a first direction of the first transistor, the fourth and sixth transistors are placed side by side sequentially on a second-hand side in the first direction of the third transistor, the second-hand side being the side opposite to the first-hand side, and the first and third transistors are placed side by side in a second direction vertical to the first direction.

According to the mode described above, the arrangement of the first to sixth transistors constituting an SRAM cell is highly symmetric. Therefore, since any asymmetric property in device characteristics is prevented or reduced, it is possible to improve the device characteristics, enhance the reliability of the semiconductor integrated circuit device, and enhance the yield.

In the second mode of the present disclosure, a semiconductor integrated circuit device provided with static random access memory (SRAM) cells using vertical nanowire (VNW) FETs includes: a memory cell array having the SRAM cells arranged in an array in a first direction and in a second direction vertical to the first direction; bit lines and inverted bit lines that extend in the second direction and are connected with the memory cell array; and an array peripheral part lying on either of the sides of the memory cell array in the second direction and overlapping the bit lines and the inverted bit lines as viewed from top, wherein the bit lines include a first bottom interconnect and a first metal interconnect formed in a metal layer, the inverted bit lines include a second bottom interconnect and a second metal interconnect formed in the metal layer, the first and second bottom interconnects and the first and second metal interconnects extend in the second direction over a plurality of SRAM cells arranged in the second direction, out of the SRAM cells, the array peripheral part includes a bit line connecting portion that electrically connects the first bottom interconnect and the first metal interconnect and electrically connects the second bottom interconnect and the second metal interconnect, at least either the first bottom interconnect and the first metal interconnect or the second bottom interconnect and the second metal interconnect are different in position in the first direction from each other, and the bit line connecting portion includes a connection interconnect extending in the first direction that electrically connects the first bottom interconnect and the first metal interconnect mutually, and/or the second bottom interconnect and the second metal interconnect mutually, which are different in position in the first direction.

According the mode described above, since the bit line pair of the bottom interconnects are connected with the bit line pair of the metal interconnects through the bit line connecting portion in the array peripheral part, reduction in the resistance of the bit line pairs can be realized. Also, for at least either the bit lines or the inverted bit lines, the positions thereof in the bottom layer and the metal interconnect layer can be displaced from each other. Therefore, in the metal interconnect layer, the bit line and the inverted bit line are avoided from being adjacent to each other, and thus noise due to crosstalk can be suppressed.

According to the present disclosure, it is possible to implement a layout structure of an SRAM cell using VNW FETs that has a highly symmetric transistor arrangement and a reduced area.

BRIEF DESCRIPTION OF THE DRAWINGS

FIG. 24A is a cross-sectional view and FIG. 24B is a plan view.

DETAILED DESCRIPTION

Embodiments of the present disclosure will be described hereinafter with reference to the accompanying drawings. In the following embodiments, it is assumed that a semiconductor integrated circuit device includes SRAM cells and that the SRAM cells include so-called vertical nanowire FETs (VNW FETs).

Figure 24A:
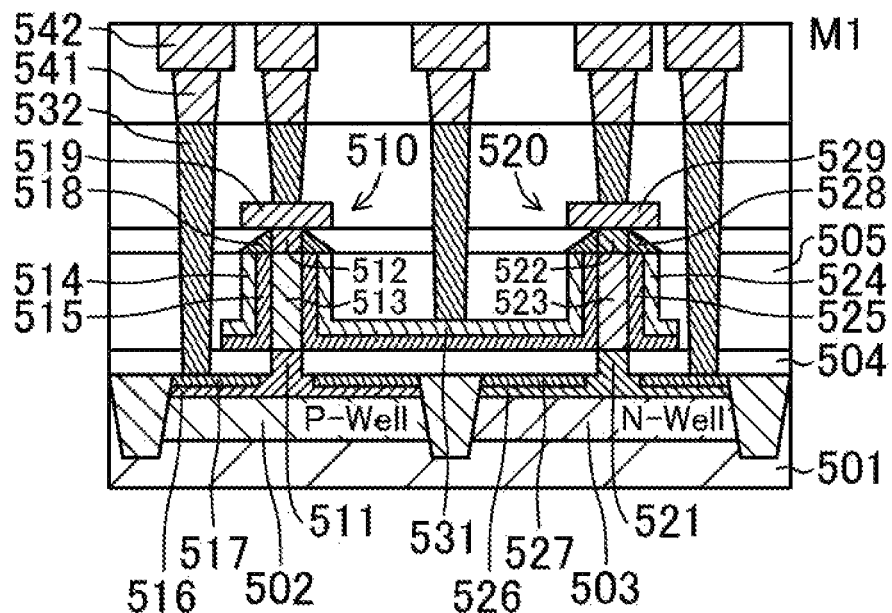
FIGS. 24A and 24B are schematic views showing a basic structure example of vertical nanowire FETs, where
Figure 24B:
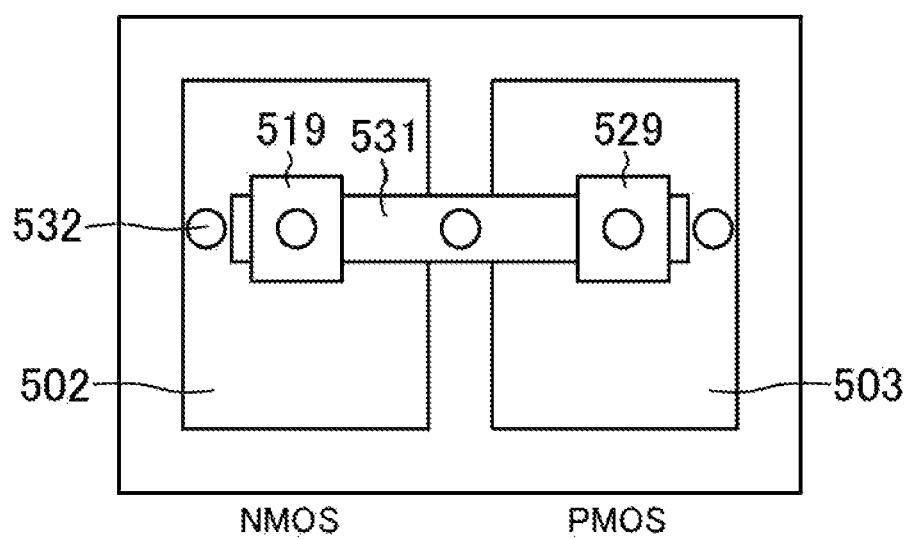

FIGS. 24A and 24B are schematic views showing a basic structure example of VNW FETs, where FIG. 24A is a cross-sectional view and FIG. 24B is a plan view. Note that, in FIG. 24B, illustration of metal interconnects is omitted and, for easy understanding, constituents invisible when actually viewed from top are illustrated.

As shown in FIGS. 24A and 24B, a p-well 502 and an n-well 503 are formed on a semiconductor substrate 501. Note however that no p-well may be formed when the semiconductor substrate 501 is a p-type substrate. A VNW FET 510 that is an n-type transistor is formed on the p-well 502, and a VNW FET 520 that is a p-type transistor is formed on the n-well 503. The reference numeral 504 denotes an insulating film, and 505 denotes an interlayer insulating film.

The VNW FET 510 includes a bottom electrode 511 that is to be a source/drain electrode, a top electrode 512 that is to be a source/drain electrode, and a nanowire 513 formed vertically (perpendicularly to the substrate surface) between the bottom electrode 511 and the top electrode 512. The bottom electrode 511 and the top electrode 512 are doped to have n-type conductivity. At least part of the nanowire 513 is to be a channel region. A gate insulating film 515 is formed around the nanowire 513, and a gate electrode 514 is formed around the gate insulating film 515.

The bottom electrode 511 is connected with a bottom region 516 formed to spread over the top surface of the semiconductor substrate 501. The bottom region 516 is also doped to have n-type conductivity. A silicide region 517 is formed on the surface of the bottom region 516. A sidewall 518 is formed around the top electrode 512, and a silicide region 519 is formed on the top of the top electrode 512. Note that the sidewall 518 and the silicide region 519 may not be formed.

Likewise, the VNW FET 520 includes a bottom electrode 521 that is to be a source/drain electrode, a top electrode 522 that is to be a source/drain electrode, and a nanowire 523 formed vertically between the bottom electrode 521 and the top electrode 522. The bottom electrode 521 and the top electrode 522 are doped to have p-type conductivity. At least part of the nanowire 523 is to be a channel region. A gate insulating film 525 is formed around the nanowire 523, and a gate electrode 524 is formed around the gate insulating film 525.

The bottom electrode 521 is connected with a bottom region 526 formed to spread over the top surface of the semiconductor substrate 501. The bottom region 526 is also doped to have p-type conductivity. A silicide region 527 is formed on the surface of the bottom region 526. A sidewall 528 is formed around the top electrode 522, and a silicide region 529 is formed on the top of the top electrode 522. Note that the sidewall 528 and the silicide region 529 may not be formed.

In the structure of FIGS. 24A and 24B, the gate electrode region 514 of the VNW FET 510 and the gate electrode region 524 of the VNW FET 520 are mutually connected through a gate interconnect 531. Also, the bottom region 516, the silicide region 519, the gate interconnect 531, the silicide region 529, and the bottom region 526 are individually connected to interconnects 542 formed in a metal interconnect layer M1 via contacts 532 and contacts 541. Another metal interconnect layer may be formed above the metal interconnect layer M1.

The semiconductor substrate 501 is made of any of bulk Si, germanium, and compounds and alloys thereof, for example. Examples of the n-type dopant include As, P, Sb, N, C, and combinations thereof. Examples of the p-type dopant include B, BF2, In, N, C, and combinations thereof. The planar shape of the VNW FETs 510 and 520 (transverse sectional shape of the nanowires 513 and 523) may be a circle, a rectangle, or an ellipse, for example.

Examples of the material of the insulating film 504 include SiN and SiCN. Examples of the material of the interlayer insulating film 505 include SiO, TEOS, PSG, BPSG, FSG, SiOC, SOG, spin-on polymers, SiC, and mixtures thereof. Examples of the material of the silicide regions 517 and 527 include NiSi, CoSi, TiSi, and WSi.

Examples of the material of the gate electrodes 514 and 524 and the gate interconnect 531 include TiN, TaN, TiAl, Ti-containing metal, Ta-containing metal, Al-containing metal, W-containing metal, TiSi, NiSi, PtSi, polysilicon with silicide, and mixtures thereof. Examples of the material of the gate insulating films 515 and 525 include SiON, $Si_3N_4$, $Ta_2O_5$, $Al_2O_3$, Hf oxide, Ta oxide, and Al oxide. The k value is preferably 7 or higher.

As the material of the silicide regions 519 and 529 provided on the top electrodes 512 and 522, NiSi, CoSi, MoSi, WSi, PtSi, TiSi, and mixtures thereof may be used. As another configuration, metals such as W, Cu, and Al, alloys such as TiN and TaN, impurity-implanted semiconductors, and mixtures thereof may be used. As the material of the sidewalls 518 and 528, SiN, SiON, SiC, SiCN, and SiOCN, for example, may be used.

As the material of the contacts 532, Ti, TiN, Ta, and TaN, for example, may be used. Cu, Cu alloy, W, Ag, Au, Ni, and Al may also be used. Alternatively, Co and Ru may be used.

Figure 25A:
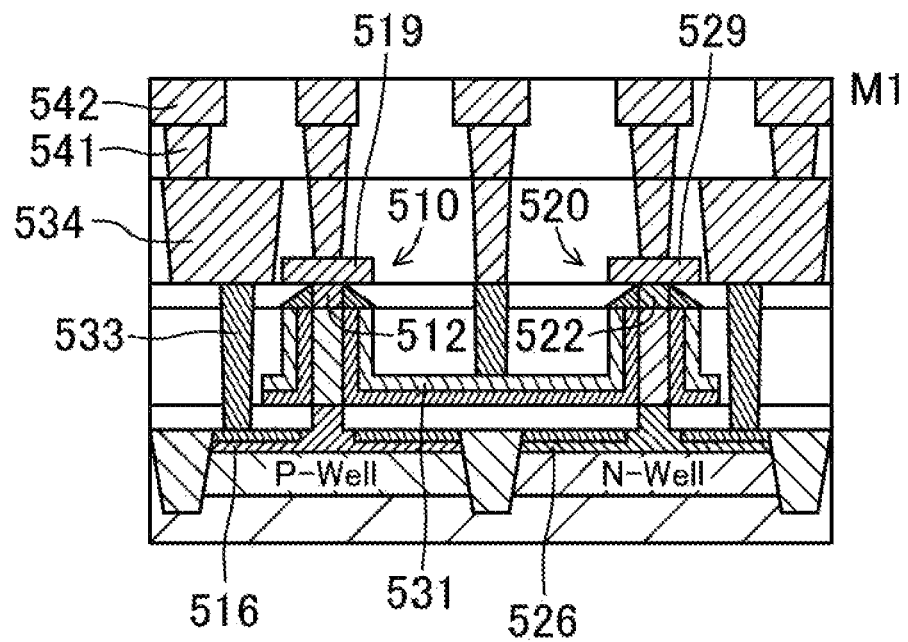
FIGS. 25A and 25B are schematic cross-sectional views showing basic structure examples of vertical nanowire FETs in which local interconnects are used.
Figure 25B:
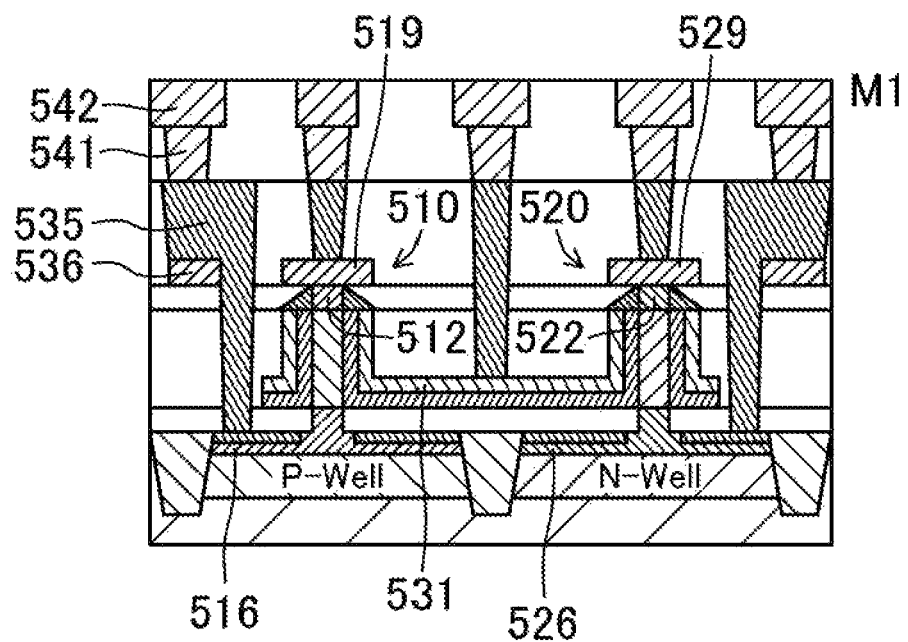

FIGS. 25A and 25B show basic structure examples of VNW FETs in which local interconnects are used. In FIG. 25A, local interconnects 534 are formed between the metal interconnect layer M1 and the top electrodes 512 and 522 of the VNW FETs 510 and 520. The bottom regions 516 and 526 and the gate interconnect 531 are individually connected to the interconnects 542 formed in the metal interconnect layer M1 via contacts 533, local interconnects 534, and the contacts 541. The silicide regions 519 and 529 are individually connected to the interconnects 542 formed in the metal interconnect layer M1 through the local interconnects 534 and the contacts 541.

In FIG. 25B, local interconnects 535 are formed between the metal interconnect layer M1 and the bottom regions 516 and 526. In other words, the local interconnect 535 corresponds to an integrated form of the contact 533 and the local interconnect 534 in FIG. 25A. Silicide regions 536 are used as an etching stopper in the process of forming the local interconnects 535.

In the following description, the bottom electrode, top electrode, and gate electrode of a VNW FET are simply referred to as the bottom, the top, and the gate, respectively, as appropriate. Also, when one or a plurality of configuration units each constituted by a vertical nanowire, a top, a bottom, and a gate constitute one VNW FET, this configuration unit is simply referred to as a "VNW" to distinguish this from the VNW FET. Also, "VDD" refers to a power supply voltage or a high voltage-side power supply line, and "VSS" refers to a power supply voltage or a low voltage-side power supply line.

In the following description, in the plan views such as FIG. 2, the horizontal direction as viewed from the figure is referred to as the X direction (corresponding to the first direction) and the vertical direction as the Y direction (corresponding to the second direction). Also, as used herein, an expression indicating that widths, etc. are the same, like the "same interconnect width" should be understood as including a range of fabrication variations.

First Embodiment

Figure 1:
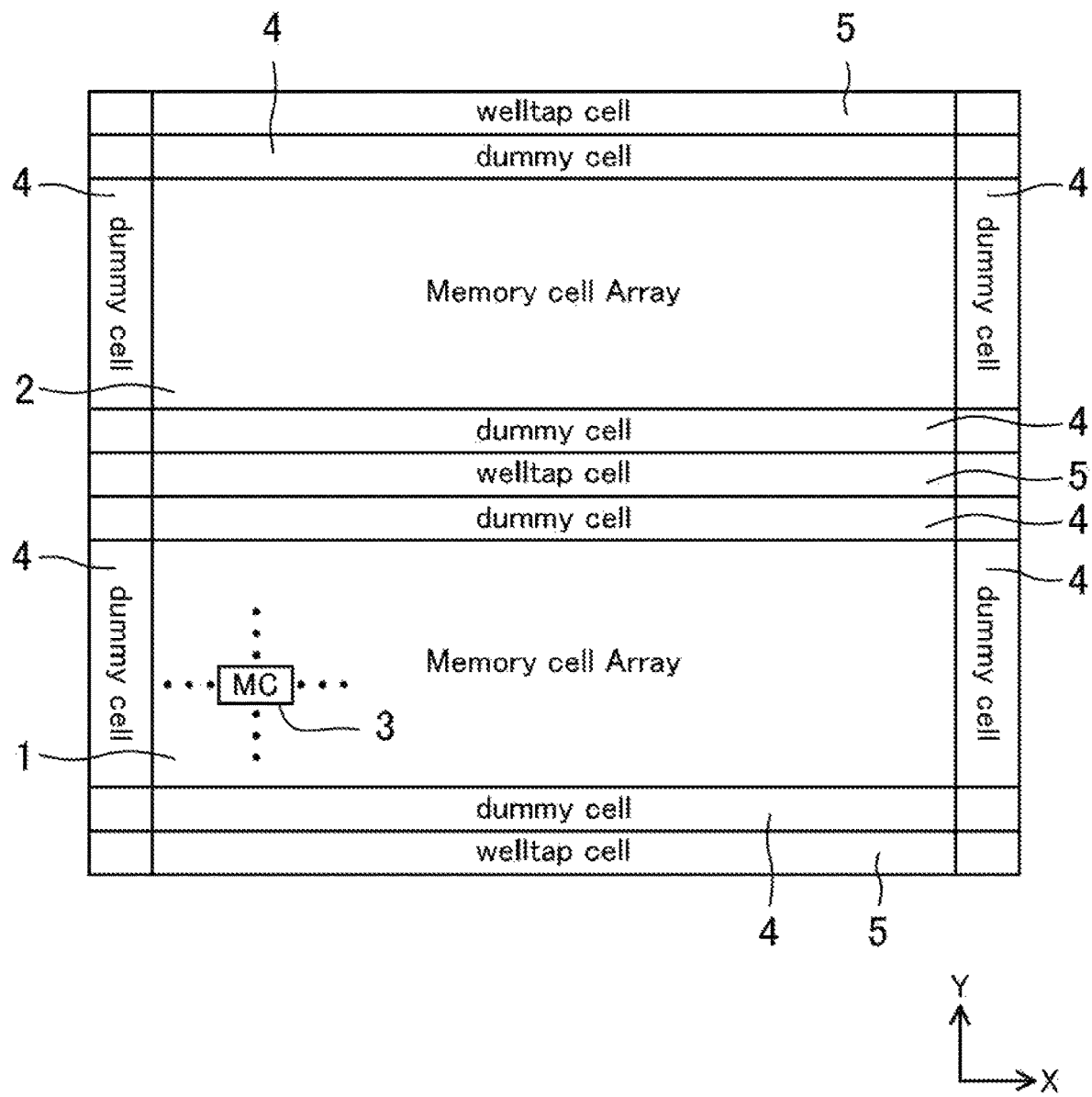
FIG. 1 is a view showing the entire configuration example of a circuit block provided with SRAM cells using VNW FETs.

FIG. 1 is a view showing an entire configuration example of a circuit block in a semiconductor integrated circuit device. The circuit block of FIG. 1 includes SRAM cells (hereinafter simply called memory cells as appropriate) using VNW FETs. Memory cell arrays 1 and 2 each include a plurality of memory cells 3 arranged in an array in the X and Y directions. The memory cell arrays 1 and 2 are placed side by side in the Y direction. Dummy memory cells 4 surround the memory cell arrays 1 and 2. The dummy memory cells 4 are placed to prevent or reduce variations in the fabrication of VNW FETs, etc. constituting memory cells at the ends of the memory cell arrays 1 and 2. Tap cells 5 are placed on the upper and lower sides of the memory cell arrays 1 and 2. The tap cells 5 supply power supply voltages to the substrate or wells.

Figure 2:
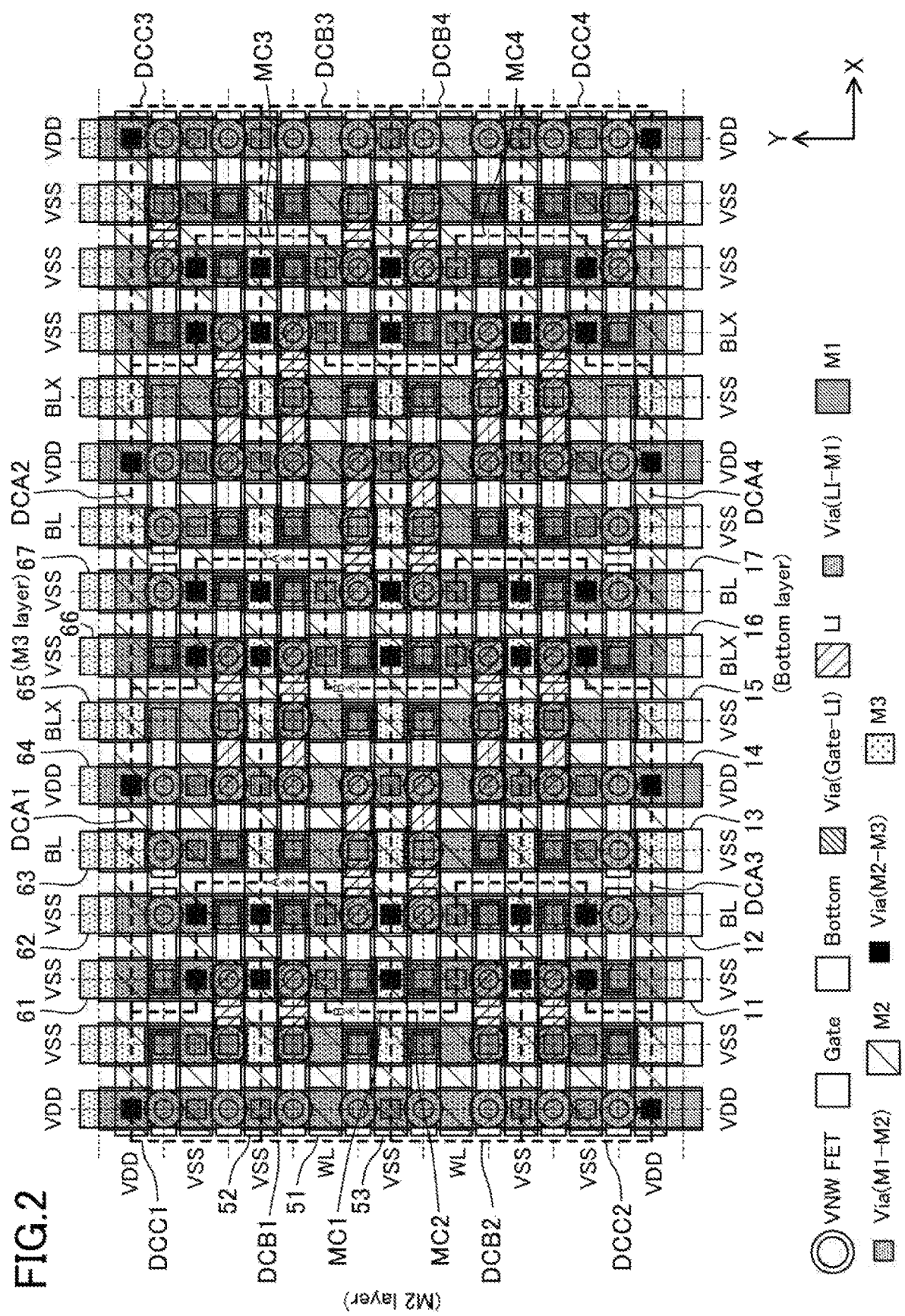
FIG. 2 is a plan view showing an example of a layout structure of SRAM cells according to the first embodiment.
Figure 3:
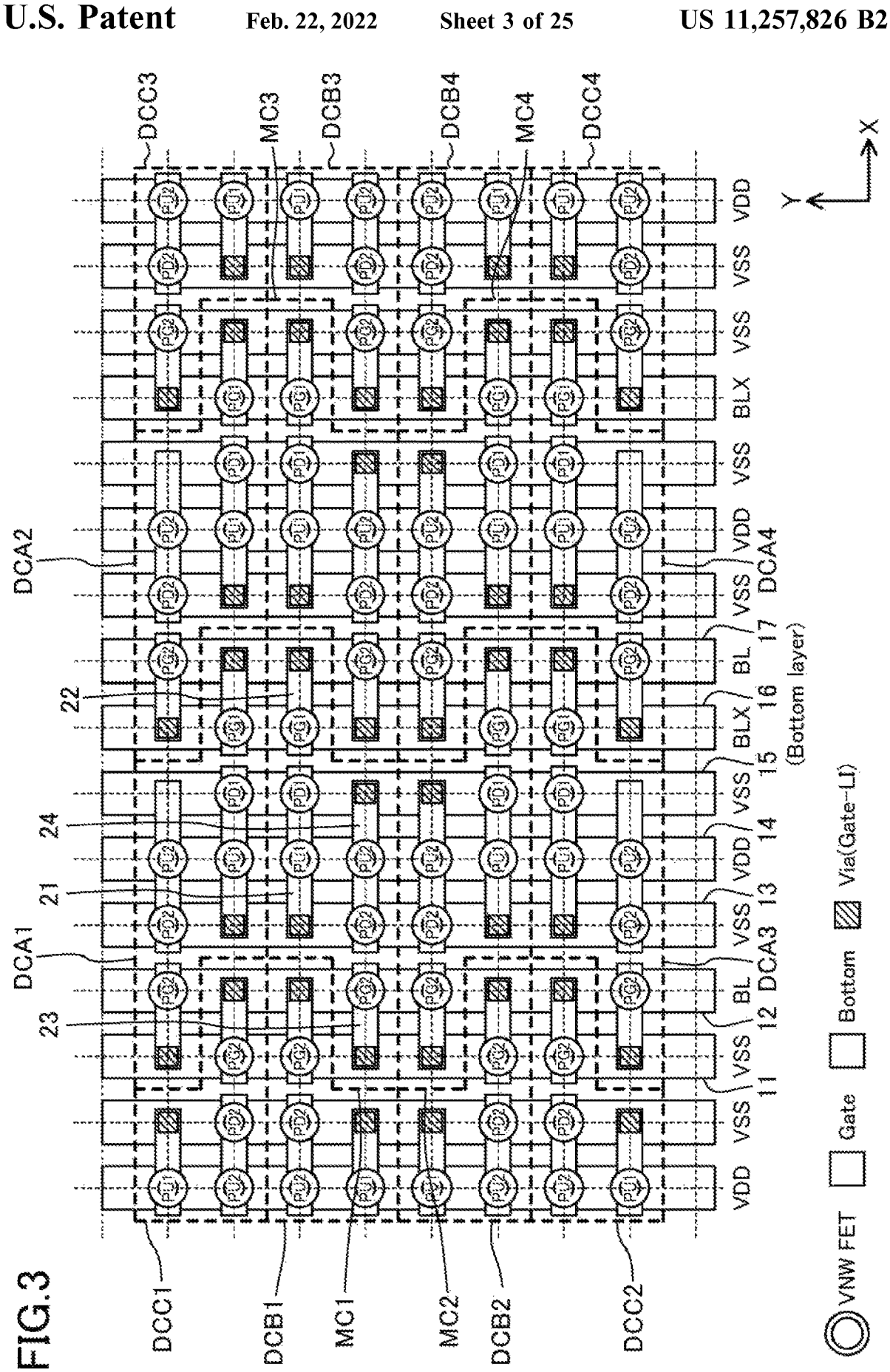
FIG. 3 is a layer-by-layer plan view showing the layout structure of FIG. 2.
Figure 4:
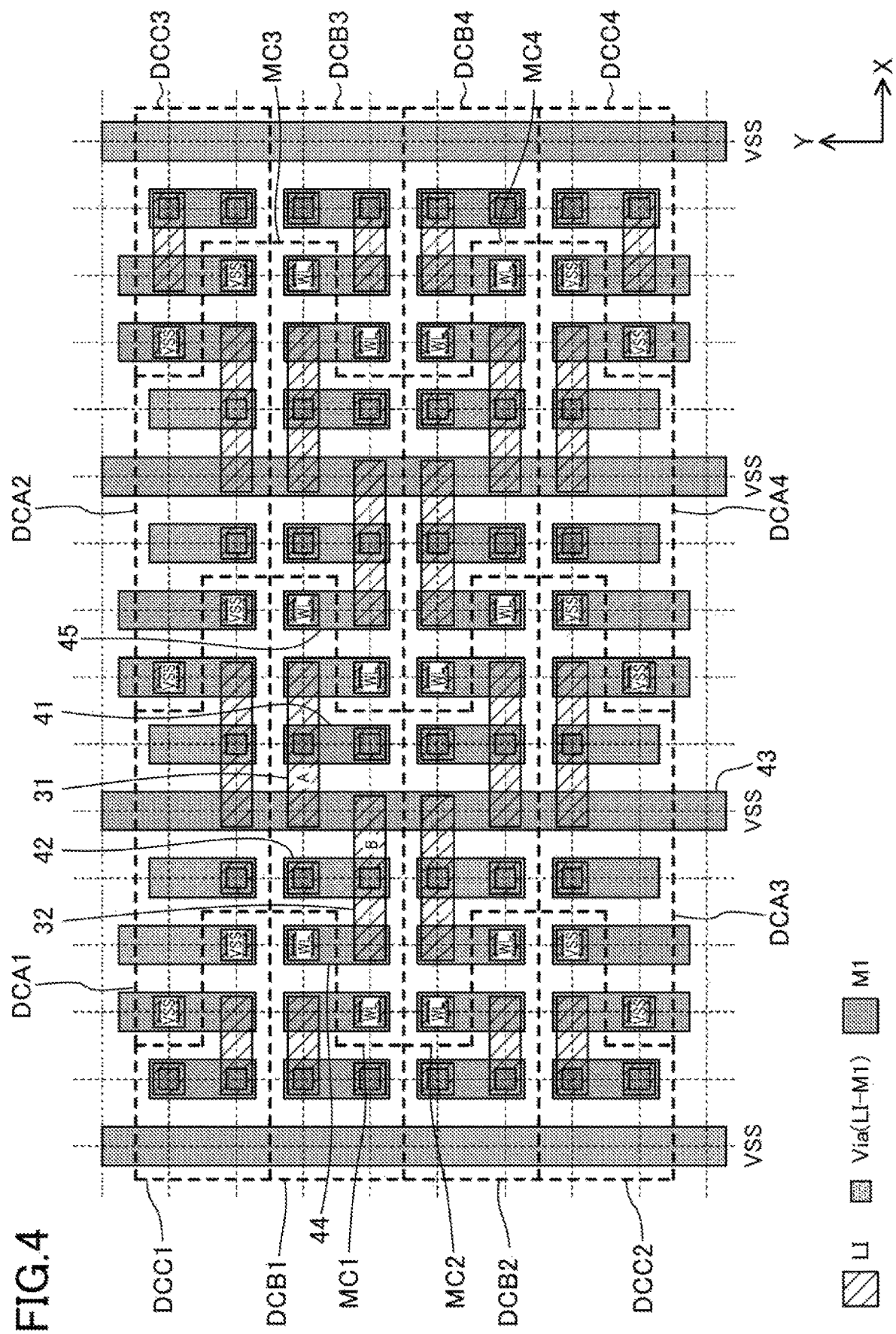
FIG. 4 is a layer-by-layer plan view showing the layout structure of FIG. 2.
Figure 5:
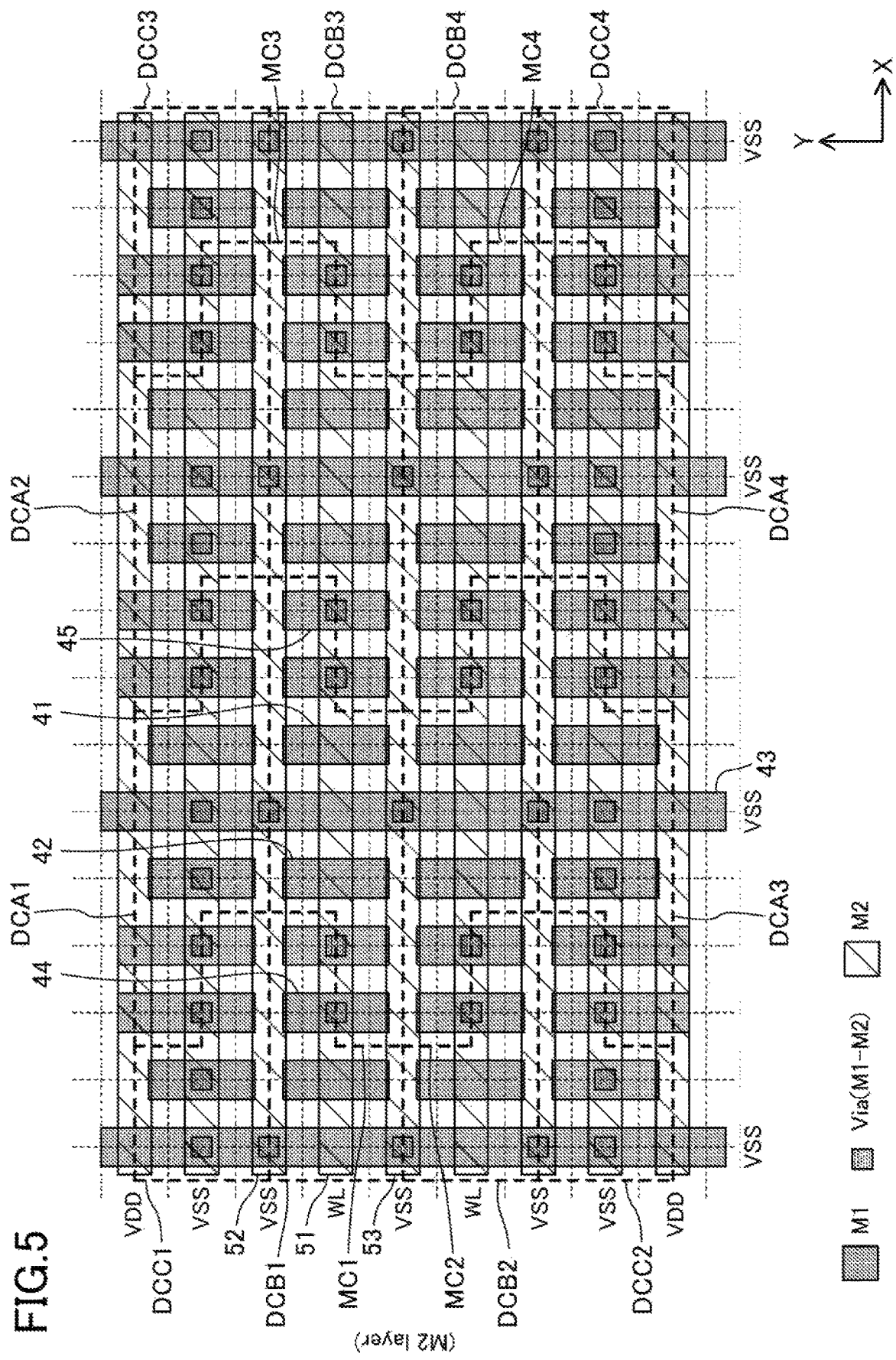
FIG. 5 is a layer-by-layer plan view showing the layout structure of FIG. 2.
Figure 6:
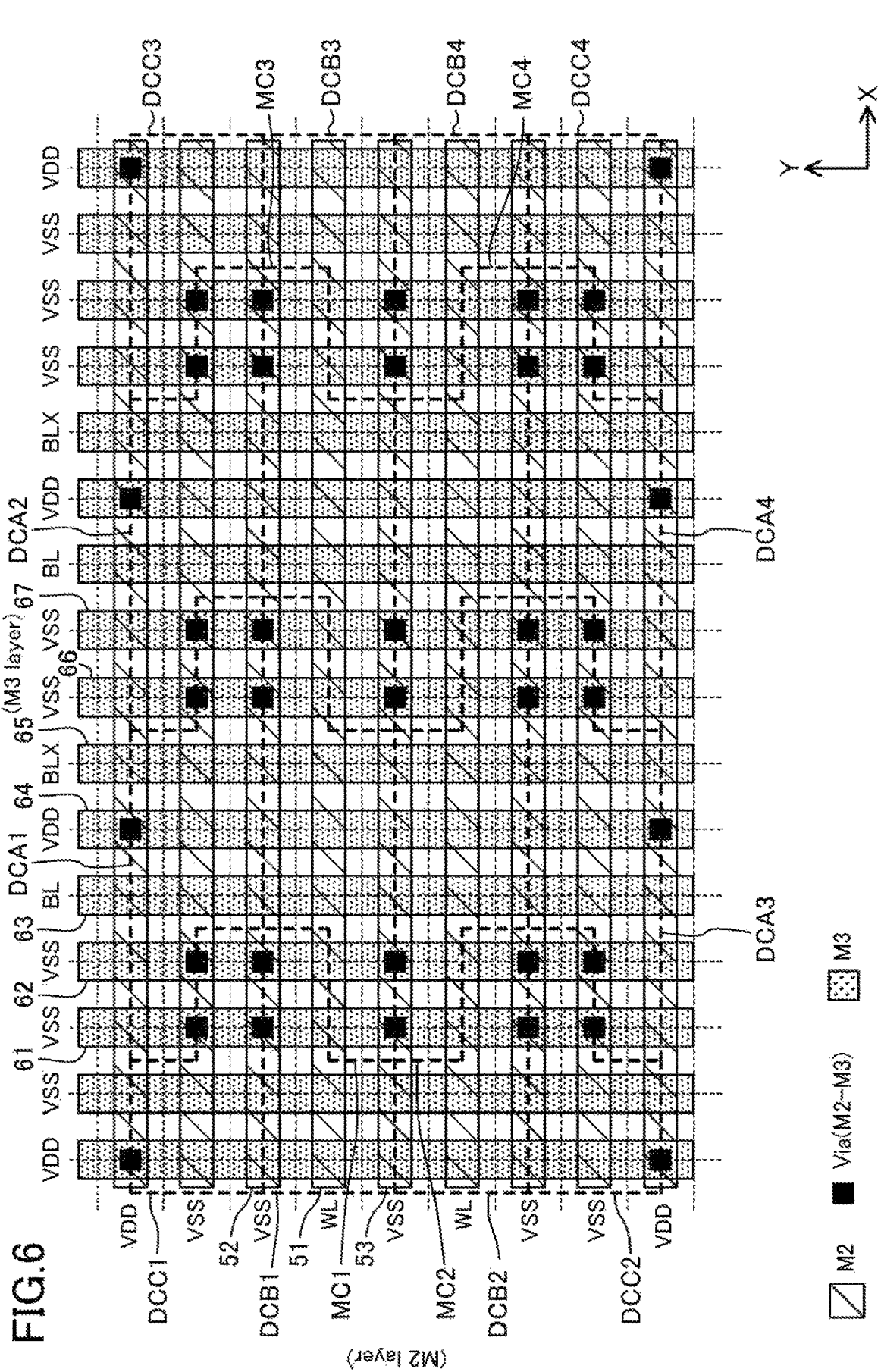
FIG. 6 is a layer-by-layer plan view showing the layout structure of FIG. 2.
Figure 7A:
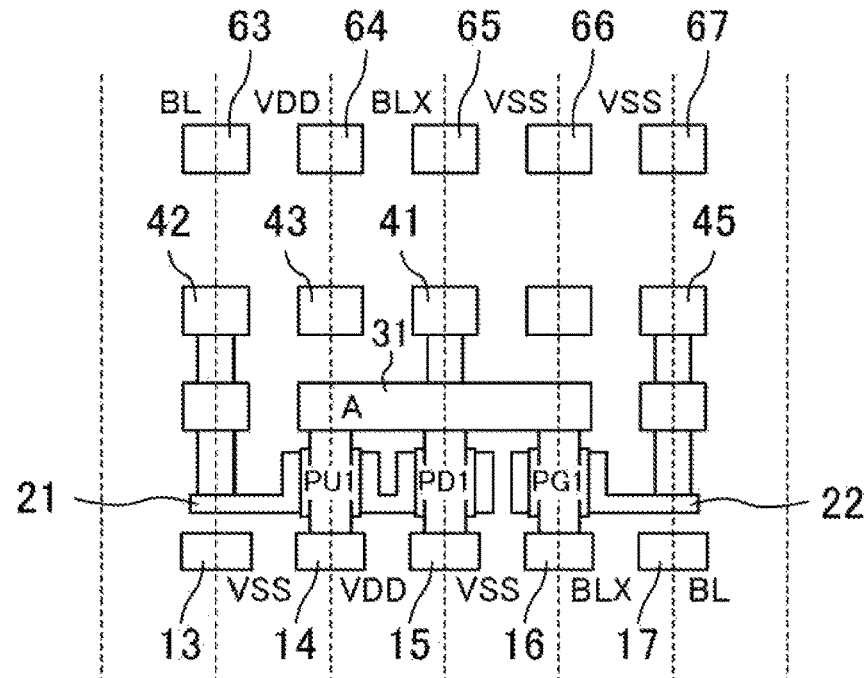
FIGS. 7A and 7B are cross-sectional views showing the layout structure of FIG. 2.
Figure 7B:
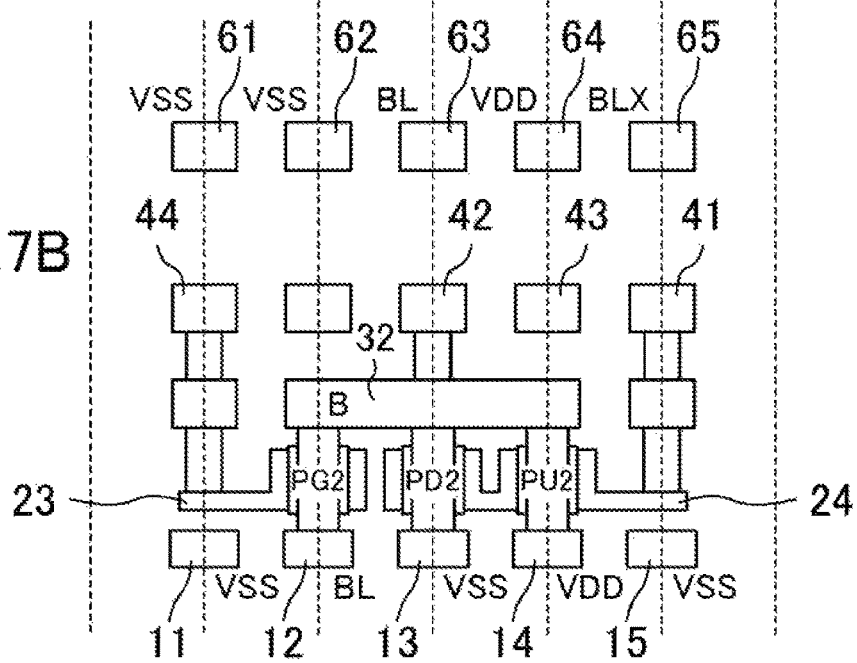

FIGS. 2 to 6 and 7A-7B are views showing an example of a layout structure of memory cells according to the first embodiment. FIG. 2 is an overall plan view and FIGS. 3 to 6 are layer-by-layer plan views. Specifically, FIG. 3 shows VNW FETs and layers below them, FIG. 4 shows local interconnects and M1 interconnects, FIG. 5 shows M1 and M2 interconnects, and FIG. 6 shows M2 and M3 interconnects. FIGS. 7A and 7B are cross-sectional views in the horizontal direction as viewed from top in FIG. 2, where FIG. 7A shows a cross section taken along line A-A', and FIG. 7B shows a cross section taken along line B-B'.

The dashed lines running vertically and horizontally in the plan views such as FIG. 2 and the dashed lines running vertically in the cross-sectional views such as FIGS. 7A-7B represent grid lines used for placement of components at the time of designing. The grid lines are placed at equal spacing in the X direction and placed at equal spacing in the Y direction. The grid spacing may be the same, or different from each other, in the X and Y directions. Also, the grid spacing may be different between layers. For example, grid lines for VNW FETs and grid lines for M1 interconnects may be placed at different spacing. Further, the components are not necessarily required to lie on grid lines. It is however preferable to place the components on grid lines from the standpoint of preventing or reducing fabrication variations.

The device structure according to this embodiment is based on the structure of FIG. 25A, although it can be a structure based on the structure of FIG. 24 or FIG. 25B, or based on any other device structure. This also applies to the subsequent embodiments. Also, for easy understanding of the figures, illustration of the wells, the STIs, the insulating films, the silicide layers on the bottoms, the silicide layers on the tops, and the sidewalls of the tops is omitted. This also applies to the subsequent drawings.

Figure 8A:
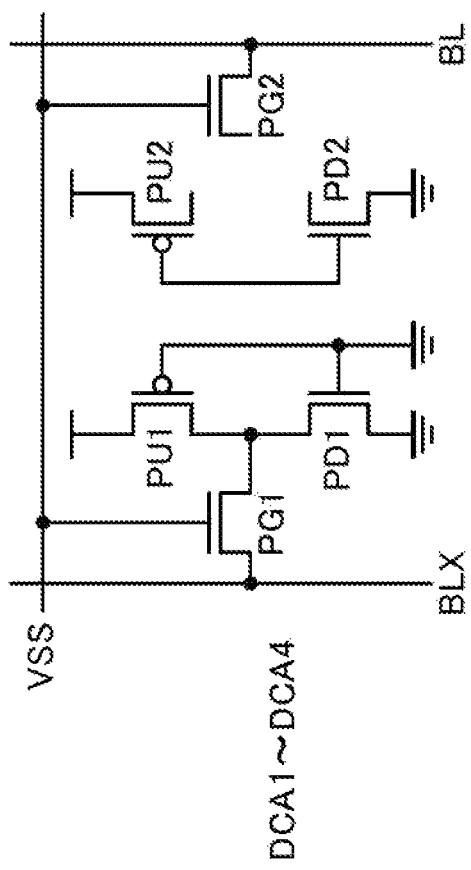
FIGS. 8A to 8D are circuit diagrams of an SRAM cell (FIG. 8A) and dummy memory cells (FIGS. 8B to 8D).
Figure 8B:
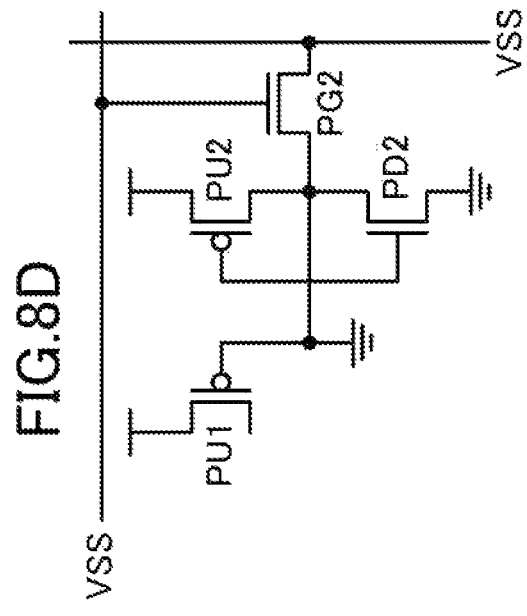
Figure 8C:
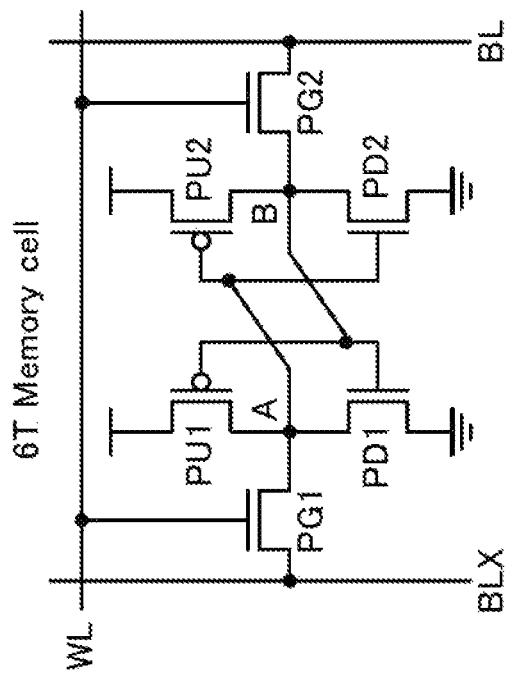
Figure 8D:
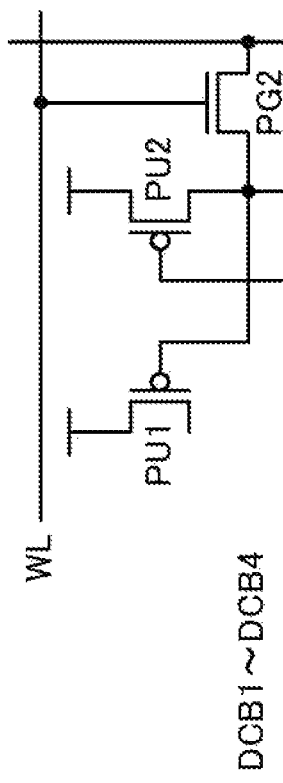

FIG. 8A is a circuit diagram of a memory cell shown in FIGS. 2 to 6 and 7A-7B. The memory cell according to this embodiment implements a 6 T type one-port memory cell shown in FIG. 8A. Note that there is a case where the connecting positions of a bit line BL and an inverted bit line BLX are reversed, for convenience of the layout. FIGS. 8B to 8D are circuit diagrams of dummy memory cells to be described later.

As shown in FIG. 8A, the 6 T memory cell according to this embodiment includes transistors PU1 and PD1 that are serially connected between VDD and VSS and of which the gates are mutually connected, transistors PU2 and PD2 that are serially connected between VDD and VSS and of which the gates are mutually connected, and transistors PG1 and PG2 as access transistors of which the gates are connected to a word line WL. The transistors PU1 and PU2 are of a p-conductivity type and transistors PD1, PD2, PG1, and PG2 are of an n-conductivity type. The connection node of the transistors PU1 and PD1, which is memory node A, is connected with the gates of the transistor PU2 and PD2. The connection node of the transistors PU2 and PD2, which is memory node B, is connected with the gates of the transistor PU1 and PD1. The transistor PG1 is connected between the memory node A and the inverted bit line BLX, and the transistor PG2 is connected between the memory node B and the bit line BL.

FIGS. 2 to 6 show the layout of four adjacently placed memory cells MC1, MC2, MC3, and MC4 and the periphery thereof. For convenience of description, it is herein assumed that the memory cell array is constituted by four memory cells MC1, MC2, MC3, and MC4 and that dummy memory cells are placed around the memory cell array. Dummy memory cells DCA1 to DCA4 are placed on the upper and lower sides (both sides in the Y direction) of the memory cell array. Dummy memory cells DCB1 to DCB4 are placed on the left and right sides (both sides in the X direction) of the memory cell array. Dummy memory cells DCC1 to DCC4 are placed at the four corners of the memory cell array.

The memory cells MC1 to MC4 have the same structure, although the memory cells MC2 and MC4 have a structure inverted vertically (in the Y direction) from the memory cell MC1. FIG. 8B is a circuit diagram of the dummy memory cells DCA1 to DCA4, FIG. 8C is a circuit diagram of the dummy memory cells DCB1 to DCB4, and FIG. 8D is a circuit diagram of the dummy memory cells DCC1 to DCC4.

Taking the memory cell MC1 as an example, the layout structure will be described hereinafter in detail.

The transistors PU1, PU2, PD1, PD2, PG1, and PG2 are VNW FETs and each have one VNW. The transistors PU1, PD1, and PG1 are arranged in a line in the X direction, and the transistors PU2, PD2, and PG2 are arranged in a line in the X direction. The transistors PD1 and PG1 lie side by side in this order on the right side (corresponding to the first-hand side in the X direction) of the transistor PU1, and the transistors PD2 and PG2 lie side by side in this order on the left side (corresponding to the second-hand side in the X direction) of the transistor PU2. The transistors PU1 and PU2 are placed side by side in the Y direction. An n-well (not shown) is formed under the p-type transistors PU1 and PU2, and a p-substrate is, or a p-well is formed, under the n-type transistors PG1, PG2, PD1, and PD2.

Bottom interconnects 11, 12, 13, 14, 15, 16, and 17 are formed, which extend in the Y direction over the entire memory cell array. The bottom interconnects 11, 13, and 15 supply the power supply voltage VSS, and the bottom interconnect 14 supplies the power supply voltage VDD. The bottom interconnect 12 is a bit line BL connected to the memory cells MC1 and MC2, and the bottom interconnect 16 is an inverted bit line BLX connected to the memory cells MC1 and MC2. The bottom interconnect 17 is a bit line BL connected to the memory cells MC3 and MC4.

The bottoms of the transistors PU1 and PU2 are connected to the bottom interconnect 14 that supplies the power supply voltage VDD. The bottom of the transistor PD1 is connected to the bottom interconnect 15 that supplies the power supply voltage VSS. The bottom of the transistor PG1 is connected to the bottom interconnect 16 that is an inverted bit line BLX. The bottom of the transistor PD2 is connected to the bottom interconnect 13 that supplies the power supply voltage VSS. The bottom of the transistor PG2 is connected to the bottom interconnect 12 that is a bit line BL.

The gates of the transistors PU1 and PD1 are mutually connected through a gate interconnect 21 extending in the X direction. The gate interconnect 21 is drawn from the gate of the transistor PU1 leftward in the X direction as viewed from the figure. A gate interconnect 22 is drawn from the gate of the transistor PG1 rightward in the X direction as viewed from the figure. A gate interconnect 23 is drawn from the gate of the transistor PG2 leftward in the X direction as viewed from the figure. The gates of the transistors PU2 and PD2 are mutually connected through a gate interconnect 24 extending in the X direction. The gate interconnect 24 is drawn from the gate of the transistor PU2 rightward in the X direction as viewed from the figure.

The tops of the transistors PU1, PD1, and PG1 are connected to a local interconnect 31 extending in the X direction. The local interconnect 31 is connected with an M1 interconnect 41 extending in the Y direction through a via. The M1 interconnect 41 extends up to a range overlapping the gate interconnect 24 as viewed from top and is connected with the gate interconnect 24 through vias and a local interconnect. That is, the tops of the transistors PU1, PD1, and PG1 are connected with the gates of the transistors PU2 and PD2 through the local interconnect 31, the M1 interconnect 41, and the gate interconnect 24. The local interconnect 31, the M1 interconnect 41, and the gate interconnect 24 correspond to the memory node A. The local interconnect 31 is an example of a first signal interconnect, and the M1 interconnect 41 is an example of a first connection interconnect.

The tops of the transistors PU2, PD2, and PG2 are connected to a local interconnect 32 extending in the X direction. The local interconnect 32 is connected with an M1 interconnect 42 extending in the Y direction through a via. The M1 interconnect 42 extends up to a range overlapping the gate interconnect 21 as viewed from top and is connected with the gate interconnect 21 through vias and a local interconnect. That is, the tops of the transistors PU2, PD2, and PG2 are connected with the gates of the transistors PU1 and PD1 through the local interconnect 32, the M1 interconnect 42, and the gate interconnect 21. The local interconnect 32, the M1 interconnect 42, and the gate interconnect 21 correspond to the memory node B. The local interconnect 32 is an example of a second signal interconnect, and the M1 interconnect 42 is an example of a second connection interconnect.

An M1 interconnect 43 that supplies the power supply voltage VSS extends in the Y direction to overlap the memory cell MC1 as viewed from top, but is not directly connected with the memory cell MC1.

An M2 interconnect 51 that is a word line WL extends in the X direction, and is connected with the gate interconnect 23 through an M1 interconnect 44 extending in the Y direction, a local interconnect, and vias. The M2 interconnect 51 is also connected with the gate interconnect 22 through an M1 interconnect 45 extending in the Y direction, a local interconnect, and vias. That is, the gates of the transistors PG1 and PG2 are connected to the M2 interconnect 51, i.e., the word line WL through the M1 interconnects 44 and 45.

M2 interconnects 52 and 53 that supply the power supply voltage VSS extend in the X direction to overlap the memory cell MC1 as viewed from top, but are not directly connected with the memory cell MC1. The M2 interconnects 52 and 53 are connected with the M1 interconnect 43 through vias.

M3 interconnects 61, 62, 63, 64, 65, 66, and 67 are formed, which extend in the Y direction over the entire memory cell array. The M3 interconnect 63 is a bit line BL connected to the memory cells MC1 and MC2, and the M3 interconnect 65 is an inverted bit line BLX connected to the memory cells MC1 and MC2. The M3 interconnects 63 and 65 are not directly connected with the memory cell MC1. As will be described later, however, in a tap cell, the M3 interconnect 63 is connected with the bottom interconnect 12 that corresponds to the bit line BL, and the M3 interconnect 65 is connected with the bottom interconnect 16 that corresponds to the inverted bit line BLX. The placement position of the M3 interconnect 63 is not the same as that of the bottom interconnect 12, but is displaced from that of the bottom interconnect 12 rightward by one grid as viewed from the figure. Also, the placement position of the M3 interconnect 65 is not the same as that of the bottom interconnect 16, but is displaced from that of the bottom interconnect 16 leftward by one grid as viewed from the figure.

The M3 interconnects 61, 62, 66, and 67 supply the power supply voltage VSS, and the M3 interconnect 64 supplies the power supply voltage VDD. The M3 interconnects 61, 62, 66, and 67 and the M3 interconnect 64, however, are not directly connected with the memory cell MC1. The M3 interconnects 61, 62, 66, and 67 are connected with the M2 interconnects 52 and 53 through vias.

In the SRAM cell according to this embodiment, the arrangement of the transistors PU1, PU2, PD1, PD2, PG1, and PG2 constituting the SRAM cell is highly symmetric. Therefore, since any asymmetric property in device characteristics is prevented or reduced, it is possible to improve the device characteristics, enhance the reliability of the semiconductor integrated circuit device, and enhance the yield.

The bottom interconnects extend in the Y direction, and have the same interconnect width and a fixed interconnect pitch. The gate interconnects extend in the X direction, and have the same interconnect width and a fixed interconnect pitch. The local interconnects extend in the X direction, and have the same interconnect width and a fixed interconnect pitch. The M1 interconnects extend in the Y direction, and have the same interconnect width and a fixed interconnect pitch. The M2 interconnects extend in the X direction, and have the same interconnect width and a fixed interconnect pitch. The M3 interconnects extend in the Y direction, and have the same interconnect width and a fixed interconnect pitch.

Therefore, the fabrication precision of the semiconductor integrated circuit device improves, whereby variations in device characteristics are prevented or reduced. Note that all of the interconnects in each layer are not necessarily required to be the same in direction, interconnect width, or interconnect pitch.

(Layout of Tap Cell)

The function of a tap cell is supplying a power supply potential to the substrate or a well. In addition to this, in this embodiment, the tap cell is configured to connect a bottom interconnect and an M3 interconnect that correspond to the bit line BL and also connect a bottom interconnect and an M3 interconnect that correspond to the inverted bit line BL.

Figure 9:
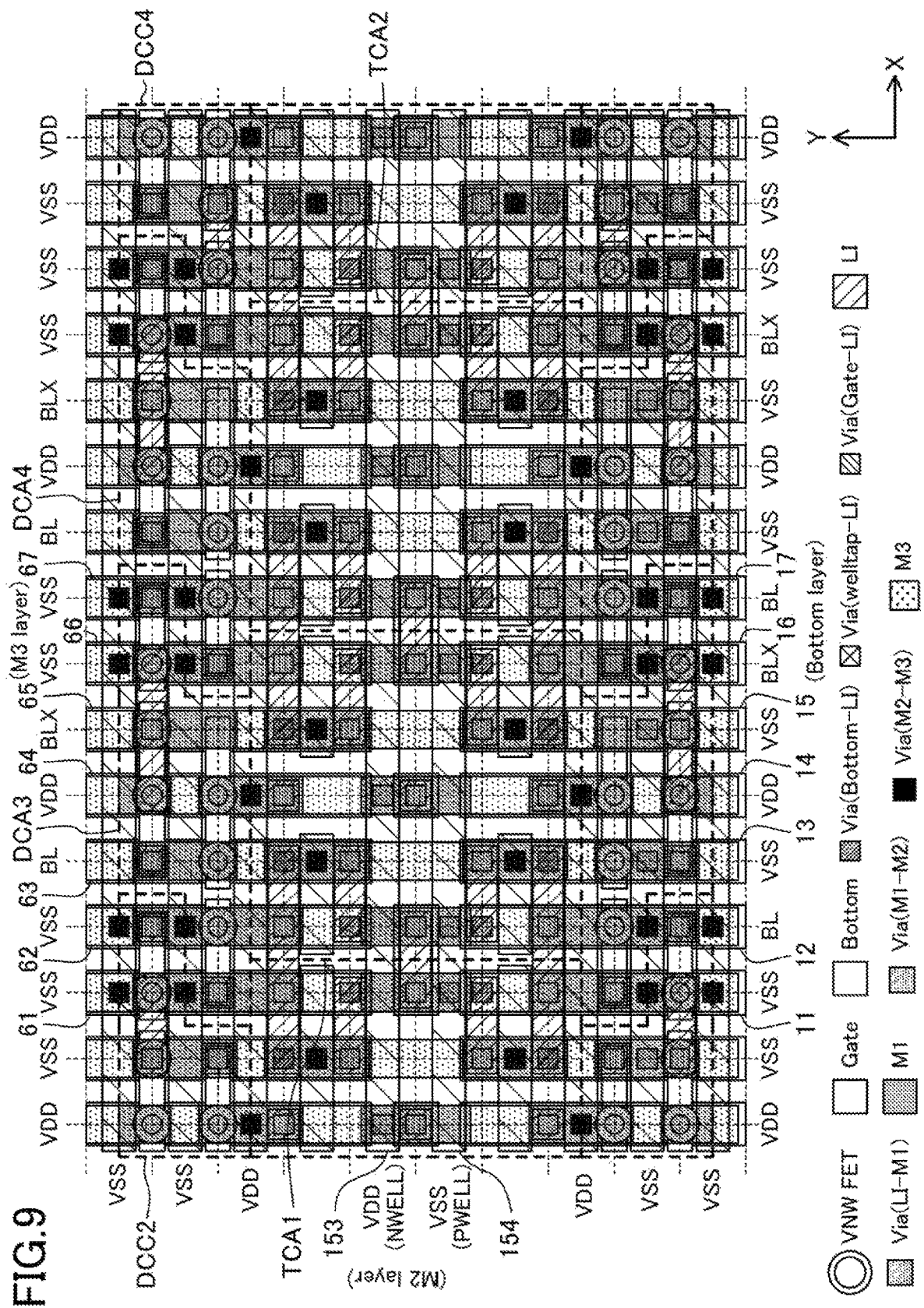
FIG. 9 is a plan view showing an example of a layout structure of tap cells in the first embodiment.
Figure 10:
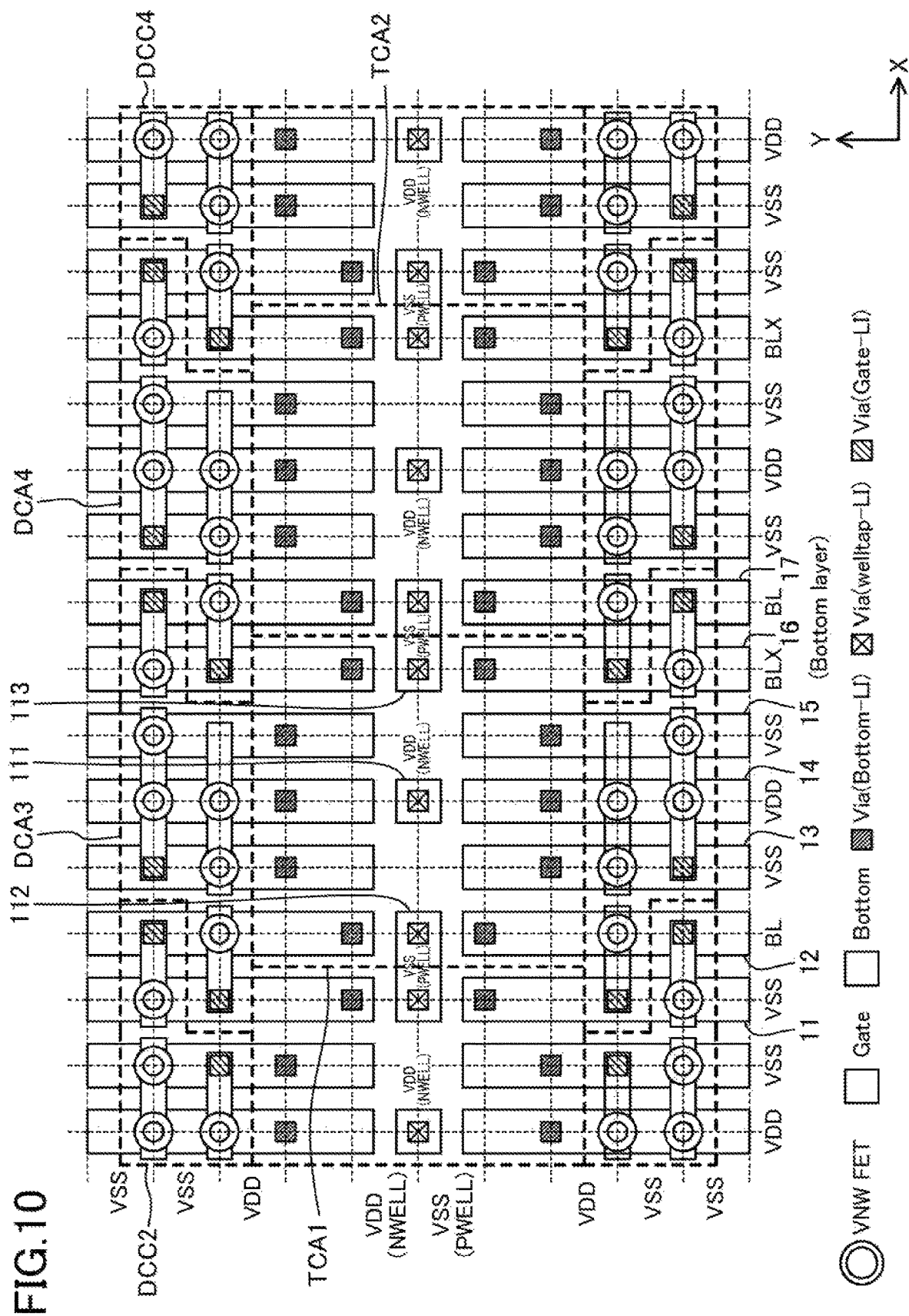
FIG. 10 is a layer-by-layer plan view showing the layout structure of FIG. 9.
Figure 11:
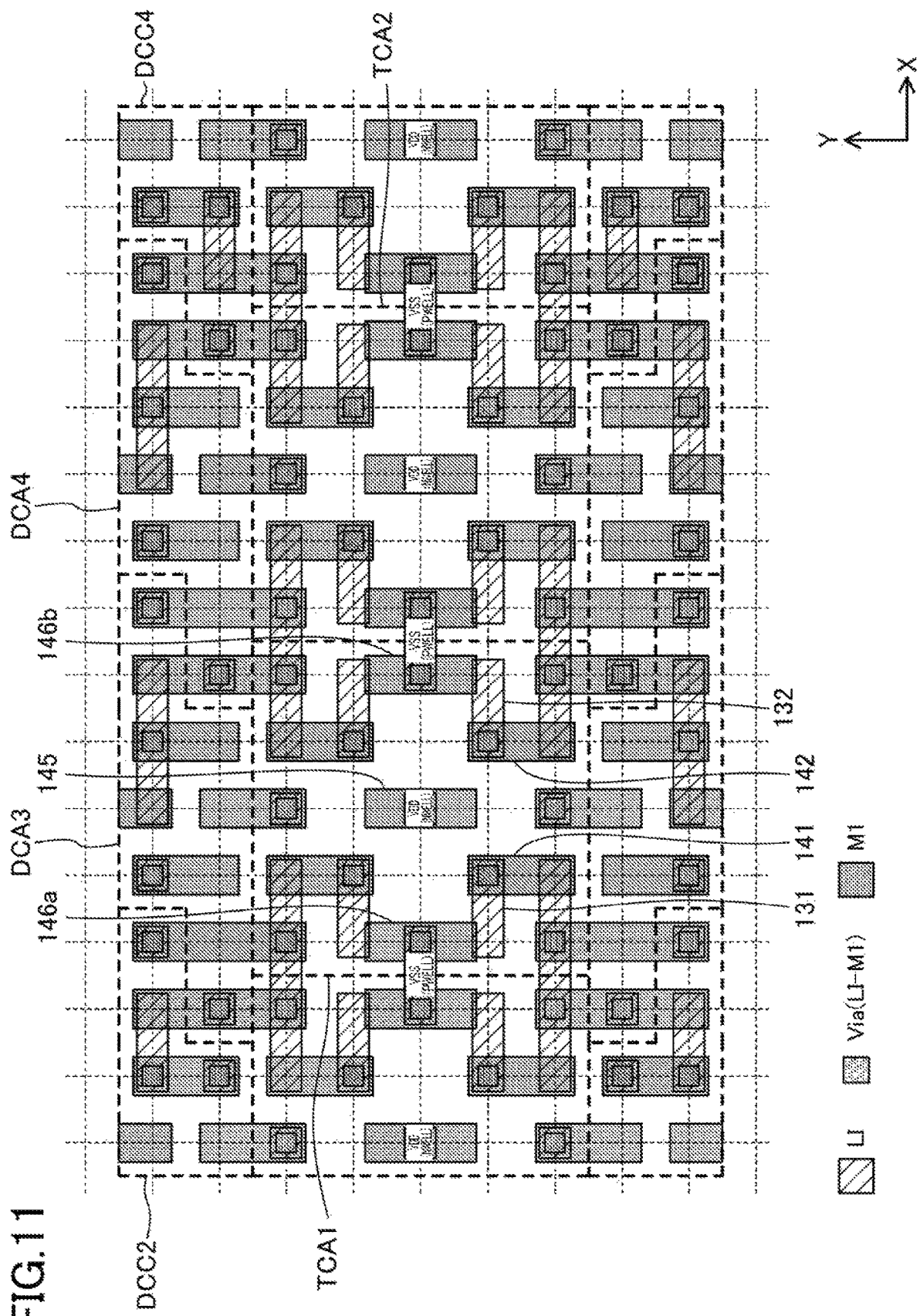
FIG. 11 is a layer-by-layer plan view showing the layout structure of FIG. 9.
Figure 12:
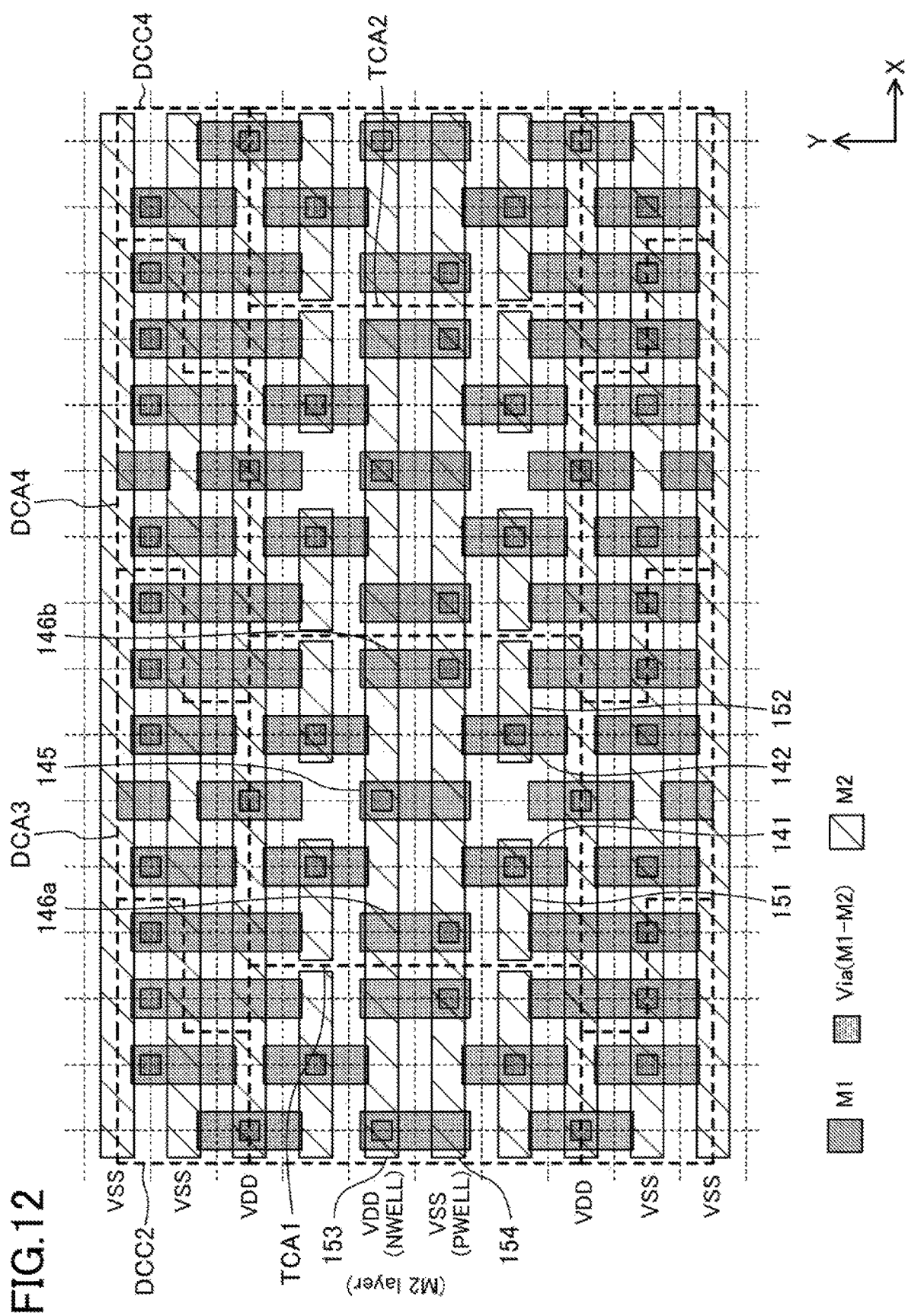
FIG. 12 is a layer-by-layer plan view showing the layout structure of FIG. 9.
Figure 13:
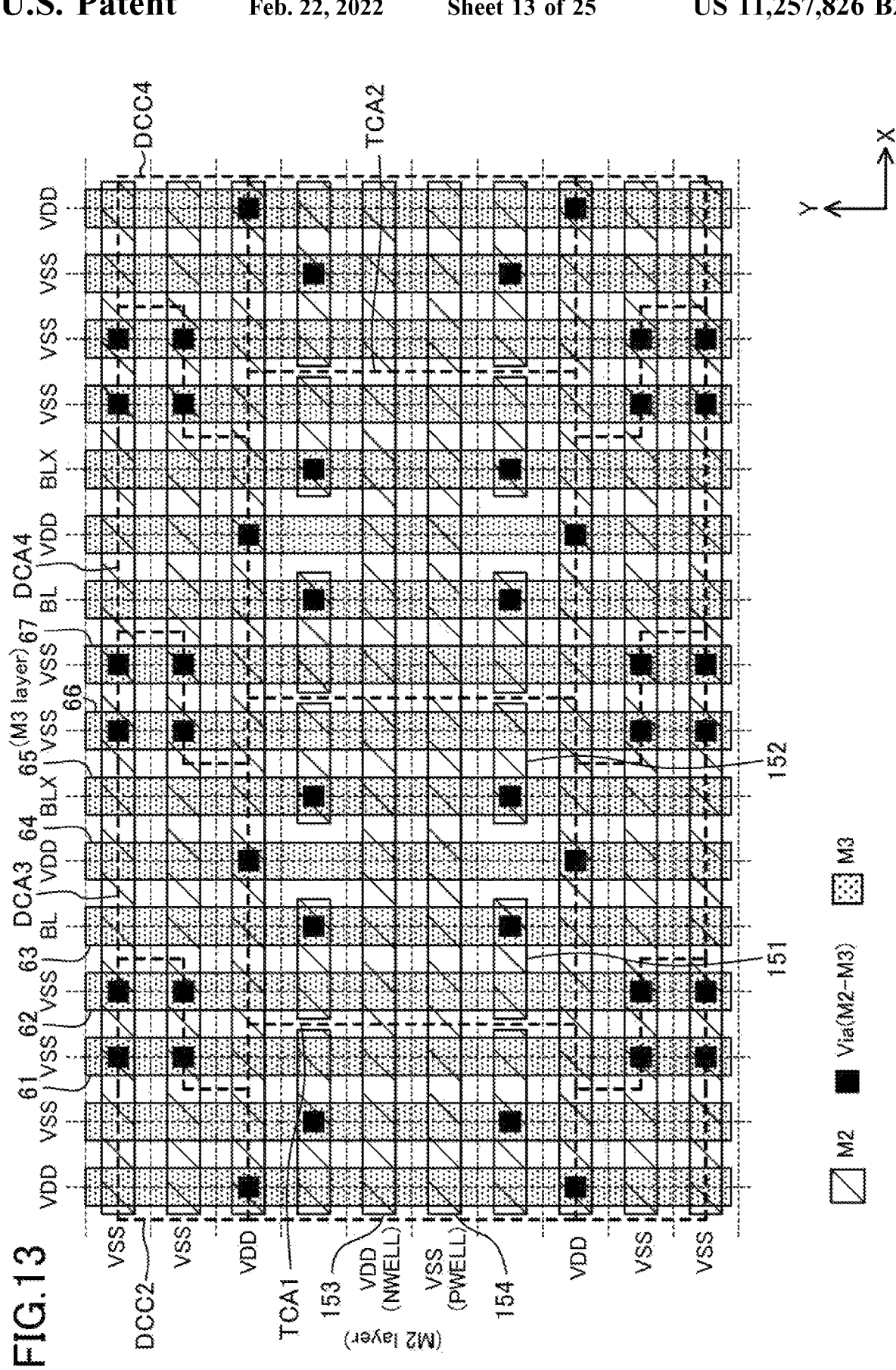
FIG. 13 is a layer-by-layer plan view showing the layout structure of FIG. 9.

FIGS. 9 to 13 show a layout configuration example of tap cells in this embodiment, where FIG. 9 is an overall plan view and FIGS. 10 to 13 are layer-by-layer plan views. Specifically, FIG. 10 shows VNW FETs and layers below them, FIG. 11 shows local interconnects and M1 interconnects, FIG. 12 shows M1 and M2 interconnects, and FIG. 13 shows M2 and M3 interconnects. The layout shown in FIGS. 9 to 13 is located on the lower side of the memory cell array described above as viewed from the figure, and another memory cell array is placed on the lower side of this layout.

FIGS. 9 to 13 show adjacently placed tap cells TCA1 and TCA2 and the periphery thereof. The tap cell TCA1 is placed at a position lining up with the memory cells MC1 and MC2 in the Y direction, and the tap cell TCA2 is placed at a position lining up with the memory cells MC3 and MC4 in the Y direction. The aforementioned dummy memory cells DCA3 and DCA4 lie on the upper side of the tap cells TCA1 and TCA2 as viewed from the figure.

Taking the tap cell TCA1 as an example, the layout structure will be described hereinafter in detail.

Bottom regions 111, 112, and 113 are provided in the center portion of the tap cell TCA1 in the Y direction. The bottom region 111, which has n-type conductivity, is formed on an n-well. The bottom regions 112 and 113, which have p-type conductivity, are formed on the p-substrate or a p-well. An M2 interconnect 153 that supplies the power supply voltage VDD and an M2 interconnect 154 that supplies the power supply voltage VSS extend in the X direction. The M2 interconnect 153 is connected with the bottom region 111 through an M1 interconnect 145. That is, the M2 interconnect 153 supplies the power supply voltage VDD to the n-well through the M1 interconnect 145 and the bottom region 111. The M2 interconnect 154 is connected with the bottom regions 112 and 113 through M1 interconnects 146a and 146b. That is, the M2 interconnect 154 supplies the power supply voltage VSS to the p-substrate or the p-well through the M1 interconnects 146a and 146b and the bottom regions 112 and 113.

The M2 interconnects 153 and 154 are not connected with other interconnects that supply power supply voltages to the memory cells. That is, the power supply voltages are supplied to the substrate or the wells separately from the power supply voltages supplied to the memory cells. Note that the M2 interconnect 153 may be connected with the M3 interconnect 64, and the M2 interconnect 154 may be connected with the M3 interconnects 62 and 66, for example, to supply the power supply voltages to the substrate or the wells and to the memory cells without separation.

The tap cell TCA1 overlaps the bottom interconnects 12 and 16 that are a bit line pair BL/BLX and the M3 interconnects 63 and 65 that are a bit line pair BL/BLX as viewed from top. In the tap cell TCA1, the bottom interconnect 12 is connected with the M3 interconnect 63 through a local interconnect 131 extending in the X direction, an M1 interconnect 141, and an M2 interconnect 151. Also, the bottom interconnect 16 is connected with the M3 interconnect 65 through a local interconnect 132 extending in the X direction, an M1 interconnect 142, and an M2 interconnect 152. The local interconnects 131 and 132 are examples of the connection interconnects.

That is, the tap cell TCA1 has a bit line connecting portion that electrically connects the bottom interconnect 12 and the M3 interconnect 63 that are both bit lines BL and electrically connects the bottom interconnect 16 and the M3 interconnect 65 that are both inverted bit lines BLX. The bit line connecting portion includes, in the illustrated example, the local interconnects 131 and 132, the M1 interconnects 141 and 142, and the M2 interconnects 151 and 152. In this way, by providing the bit line pair BL/BLX in the M3 interconnect layer and connecting this bit line pair with the bit line pair BL/BLX of the bottom interconnects through the bit line connecting portion in the tap cell, reduction in the resistance of the bit line pair BL/BLX can be realized.

Also, with the bit line connecting portion as described above, the positions of the bit lines BL in the bottom layer and the M3 interconnect layer are displaced from each other, and the positions of the inverted bit lines BLX in these layers are displaced from each other. By this placement, the bit line BL and the inverted bit line BLX are avoided from being adjacent to each other in the M3 interconnect layer, and thus noise due to crosstalk can be suppressed.

Figure 14:
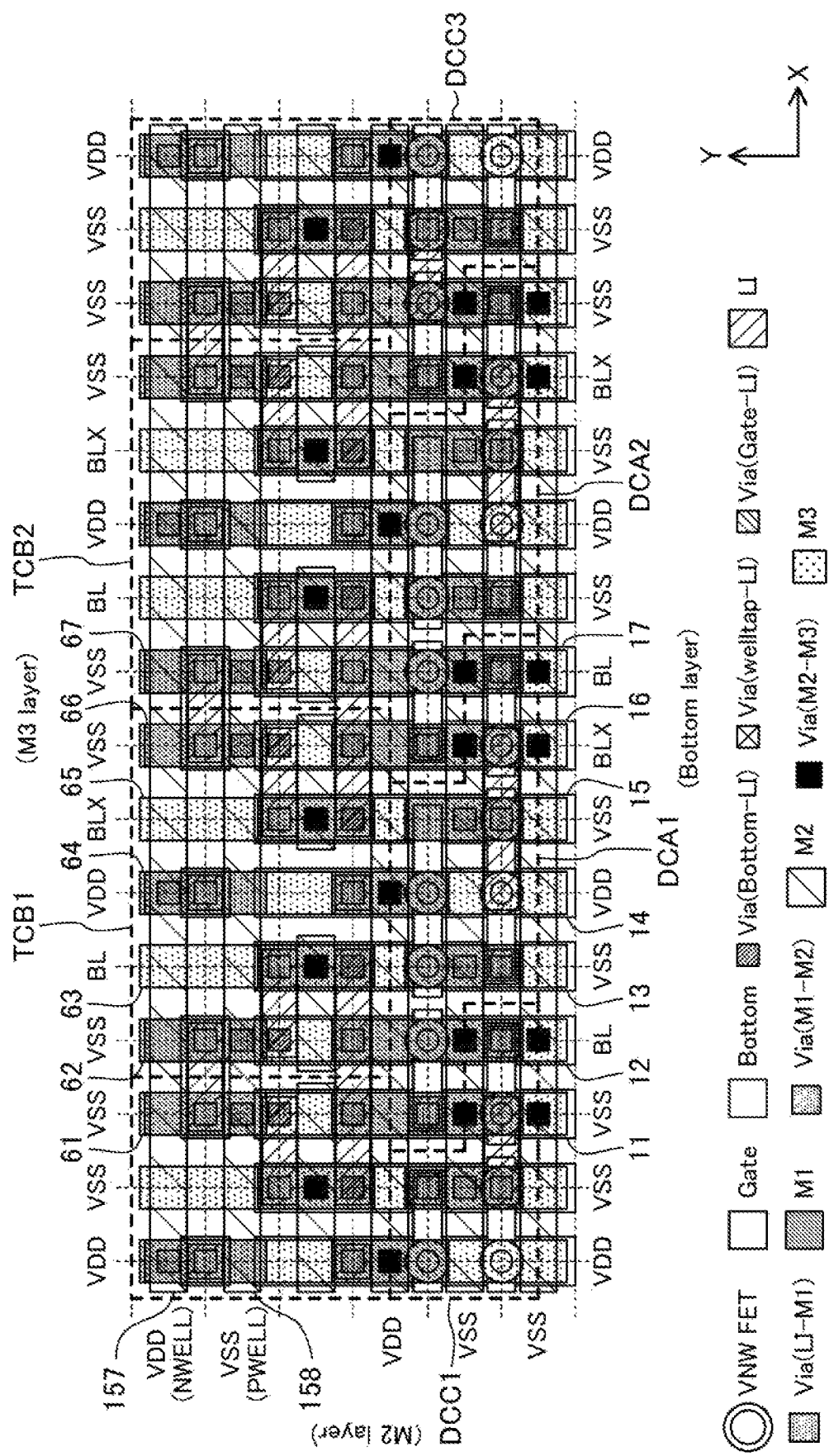
FIG. 14 is a plan view showing an example of a layout structure of tap cells in the first embodiment.
Figure 15:
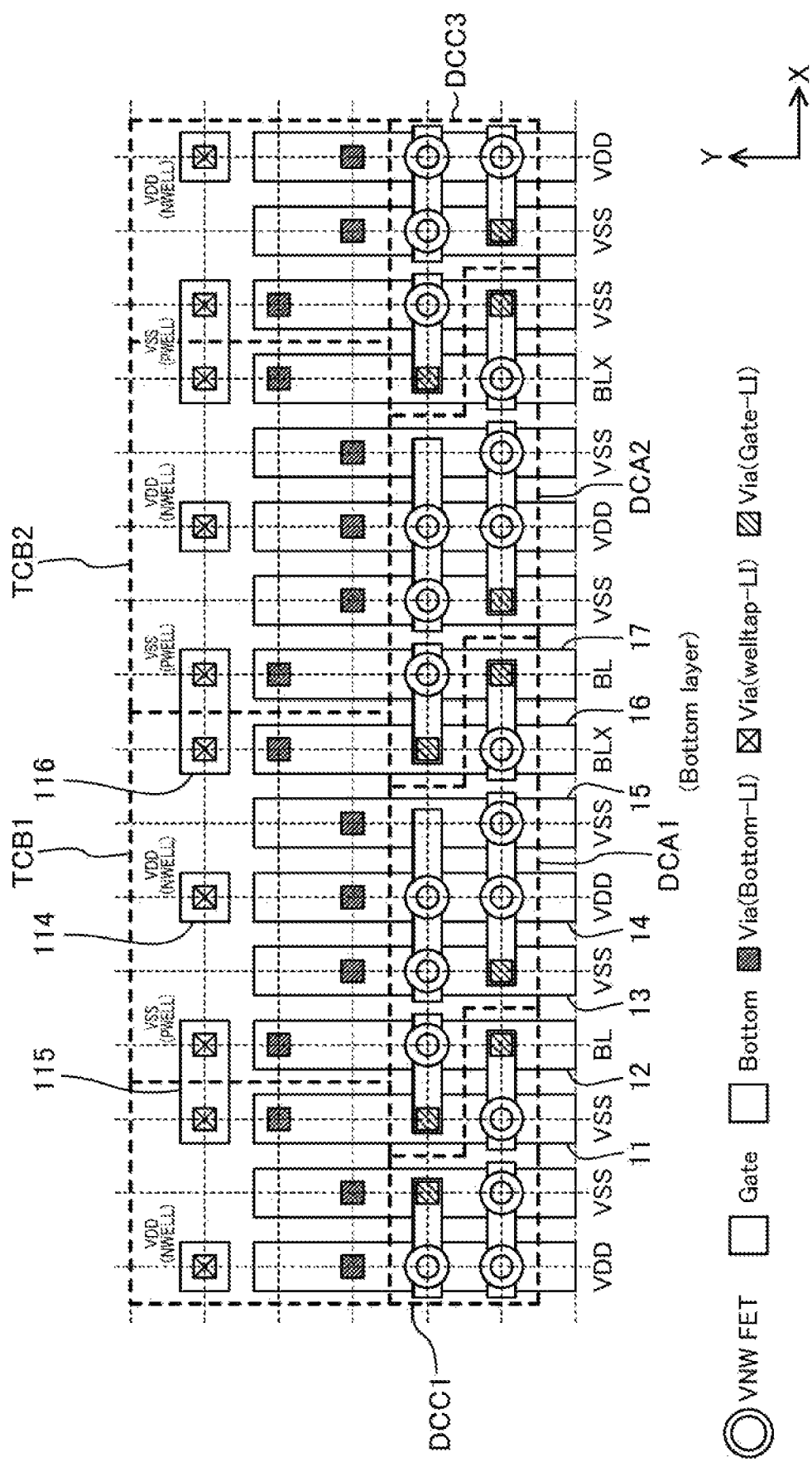
FIG. 15 is a layer-by-layer plan view showing the layout structure of FIG. 14.
Figure 16:
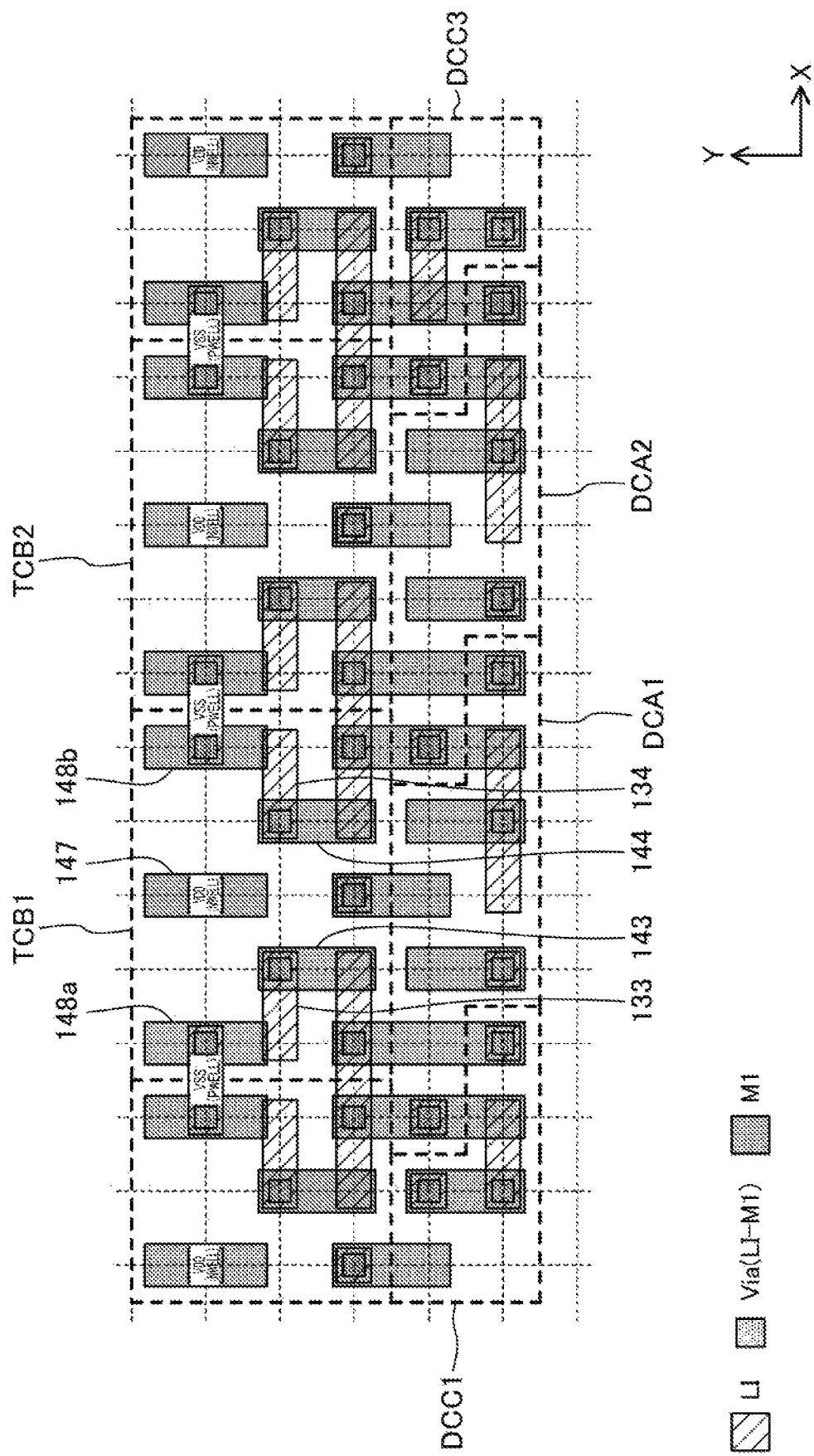
FIG. 16 is a layer-by-layer plan view showing the layout structure of FIG. 14.
Figure 17:
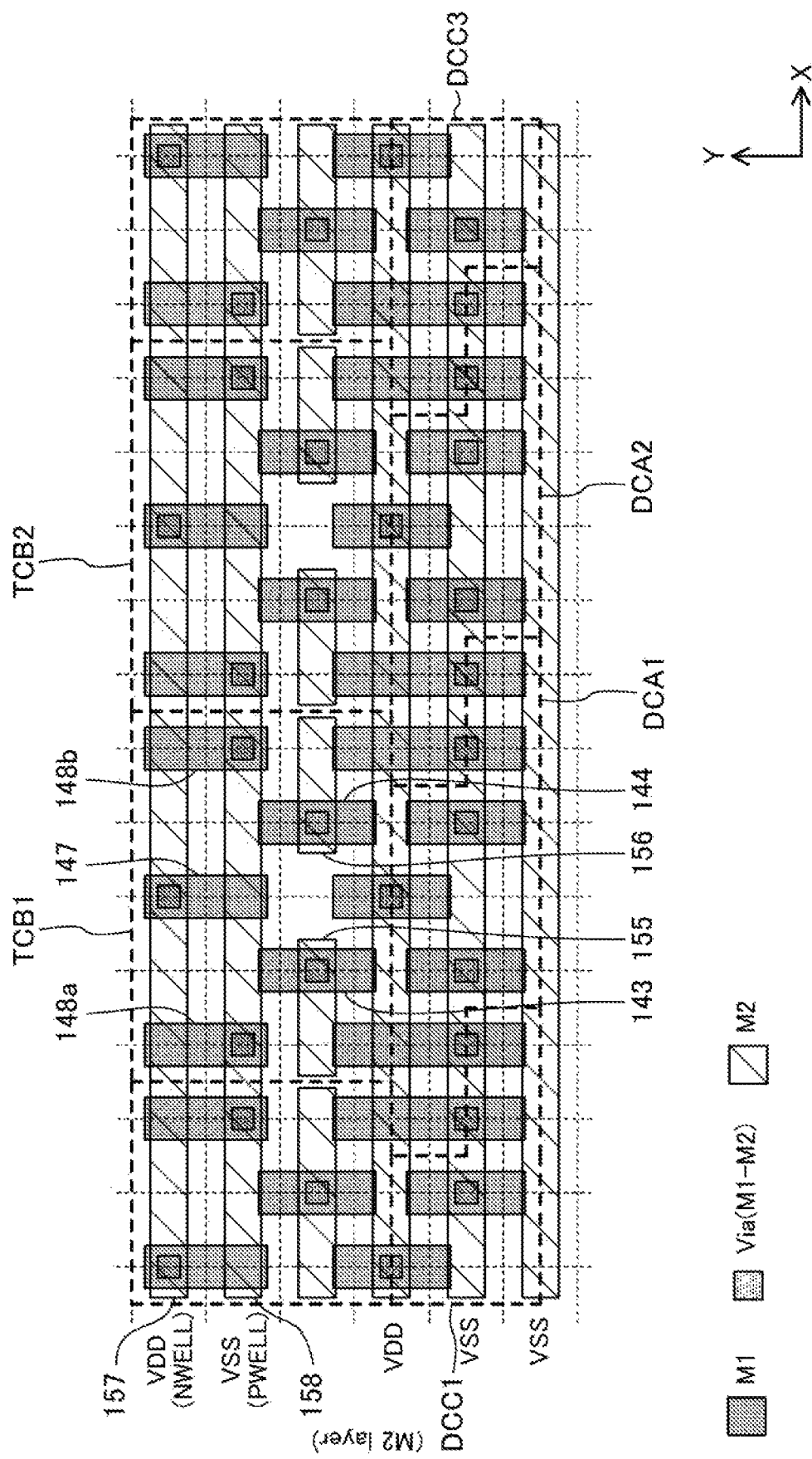
FIG. 17 is a layer-by-layer plan view showing the layout structure of FIG. 14.
Figure 18:
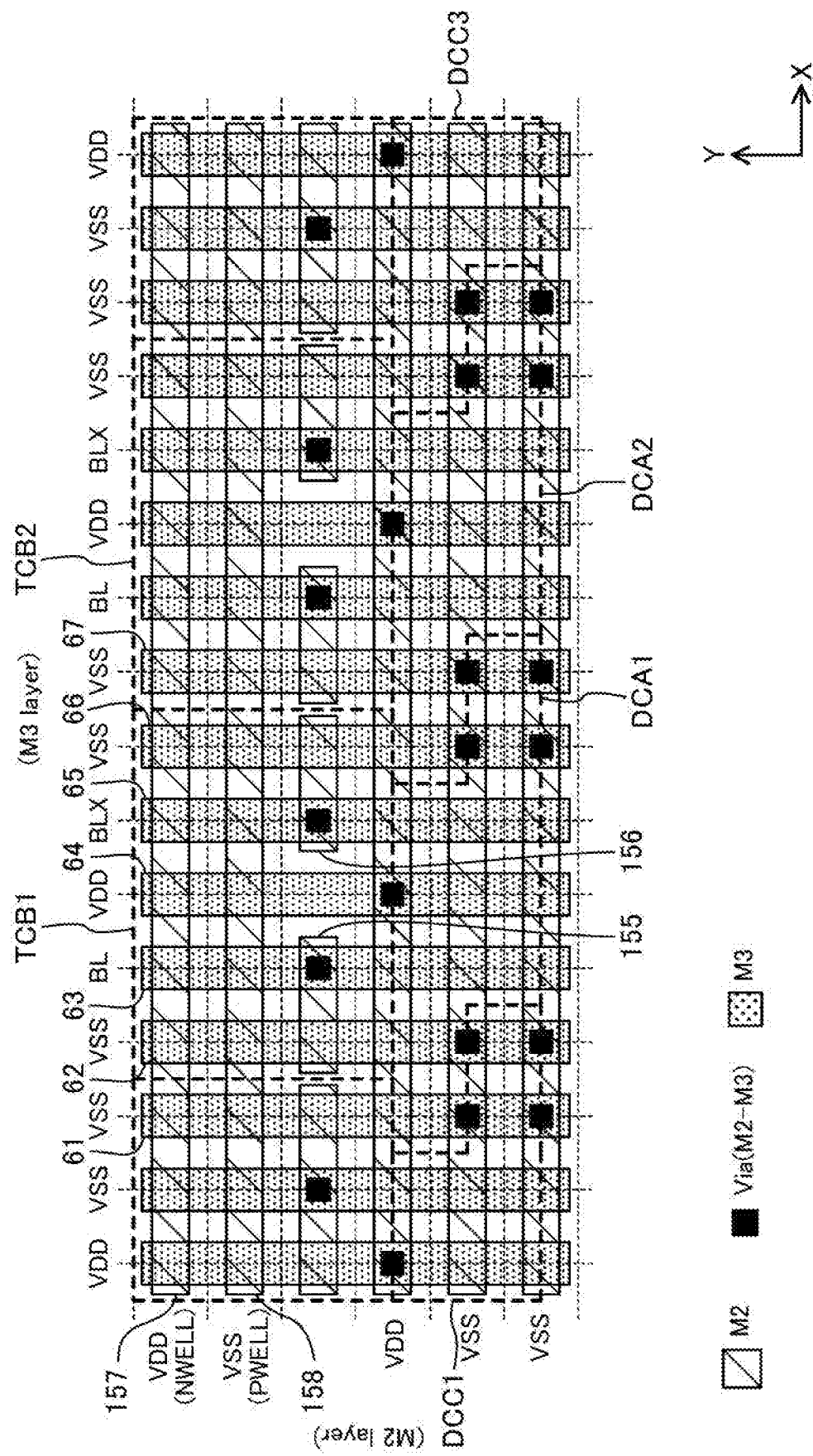
FIG. 18 is a layer-by-layer plan view showing the layout structure of FIG. 14.

FIGS. 14 to 18 show another layout configuration example of a tap cell in this embodiment, where FIG. 14 is a plan view and FIGS. 15 to 18 are layer-by-layer plan views. Specifically, FIG. 15 shows VNW FETs and layers below them, FIG. 16 shows local interconnects and M1 interconnects, FIG. 17 shows M1 and M2 interconnects, and FIG. 18 shows M2 and M3 interconnects. The layout shown in FIGS. 14 to 18 is located on the upper side of the memory cell array described above as viewed from the figure.

FIGS. 14 to 18 show adjacently placed tap cells TCB1 and TCB2 and the periphery thereof. The tap cell TCB1 is placed at a position lining up with the memory cells MC1 and MC2 in the Y direction, and the tap cell TCB2 is placed at a position lining up with the memory cells MC3 and MC4 in the Y direction. The aforementioned dummy memory cells DCA1 and DCA2 lie on the lower side of the tap cells TCB1 and TCB2 as viewed from the figure.

Taking the tap cell TCB1 as an example, the layout structure will be described hereinafter in detail. The structures of the tap cells TCB1 and TCB2 are similar to the configuration of the lower half of the tap cell TCA1 described above as viewed from the figure, and therefore description may be omitted here as appropriate.

Bottom regions 114, 115, and 116 are provided in the upper portion of the tap cell TCB1 in the Y direction. The bottom region 114, which has n-type conductivity, is formed on an n-well. The bottom regions 115 and 116, which have p-type conductivity, are formed on the p-substrate or a p-well. An M2 interconnect 157 that supplies the power supply voltage VDD and an M2 interconnect 158 that supplies the power supply voltage VSS extend in the X direction. The M2 interconnect 157 is connected with the bottom region 114 through an M1 interconnect 147. That is, the M2 interconnect 157 supplies the power supply voltage VDD to the n-well through the M1 interconnect 147 and the bottom region 114. The M2 interconnect 158 is connected with the bottom regions 115 and 116 through M1 interconnects 148a and 148b. That is, the M2 interconnect 158 supplies the power supply voltage VSS to the p-substrate or the p-well through the M1 interconnects 148a and 148b and the bottom regions 115 and 116.

The M2 interconnects 157 and 158 are not connected with other interconnects that supply power supply voltages to the memory cells. That is, the power supply voltages are supplied to the substrate or the wells separately from the power supply voltages supplied to the memory cells. Note that the M2 interconnect 157 may be connected with the M3 interconnect 64, and the M2 interconnect 158 may be connected with the M3 interconnects 62 and 66, for example, to supply the power supply voltages to the substrate or the wells and to the memory cells without separation.

The tap cell TCB1 overlaps the bottom interconnects 12 and 16 that are a bit line pair BL/BLX and the M3 interconnects 63 and 65 that are a bit line pair BL/BLX as viewed from top. In the tap cell TCB1, the bottom interconnect 12 is connected with the M3 interconnect 63 through a local interconnect 133 extending in the X direction, an M1 interconnect 143, and an M2 interconnect 155. Also, the bottom interconnect 16 is connected with the M3 interconnect 65 through a local interconnect 134 extending in the X direction, an M1 interconnect 144, and an M2 interconnect 156. The local interconnects 133 and 134 are examples of the connection interconnects.

That is, the tap cell TCB1 has a bit line connecting portion that electrically connects the bottom interconnect 12 and the M3 interconnect 63 that are bit lines BL and electrically connects the bottom interconnect 16 and the M3 interconnect 65 that are inverted bit lines BLX. The bit line connecting portion includes, in the illustrated example, the local interconnects 133 and 134, the M1 interconnects 143 and 144, and the M2 interconnects 155 and 156. In this way, by providing the bit line pair BL/BLX in the M3 interconnect layer and connecting this bit line pair with the bit line pair BL/BLX of the bottom interconnects through the bit line connecting portion in the tap cell, reduction in the resistance of the bit line pair BL/BLX can be realized.

Also, with the bit line connecting portion as described above, the positions of the bit lines BL in the bottom layer and the M3 interconnect layer are displaced from each other, and the positions of the inverted bit lines BLX in these layers are displaced from each other. By this placement, the bit line BL and the inverted bit line BLX are avoided from being adjacent to each other in the M3 interconnect layer, and thus noise due to crosstalk can be suppressed.

Second Embodiment

Figure 19:
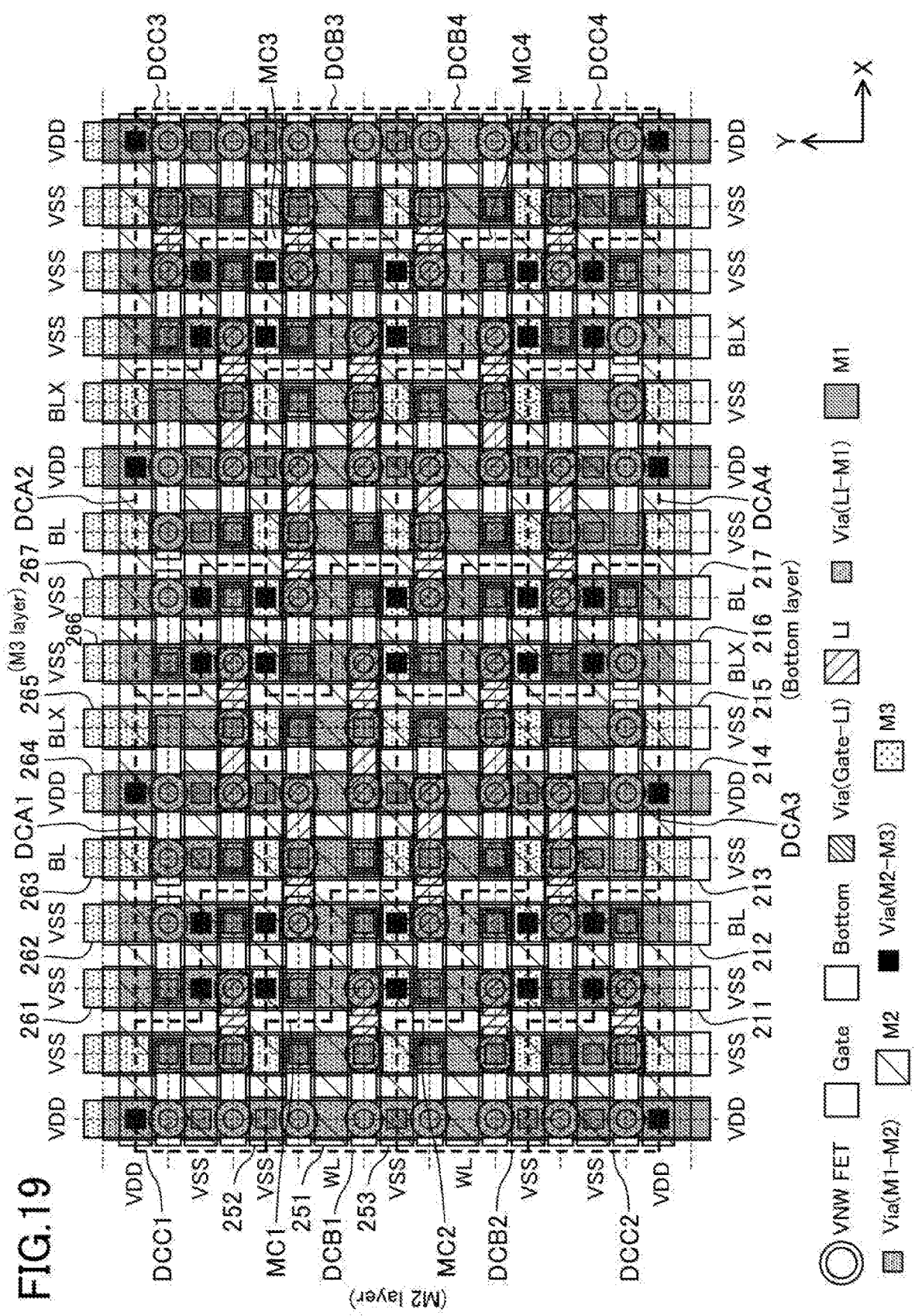
FIG. 19 is a plan view showing an example of a layout structure of SRAM cells according to the second embodiment.
Figure 20:
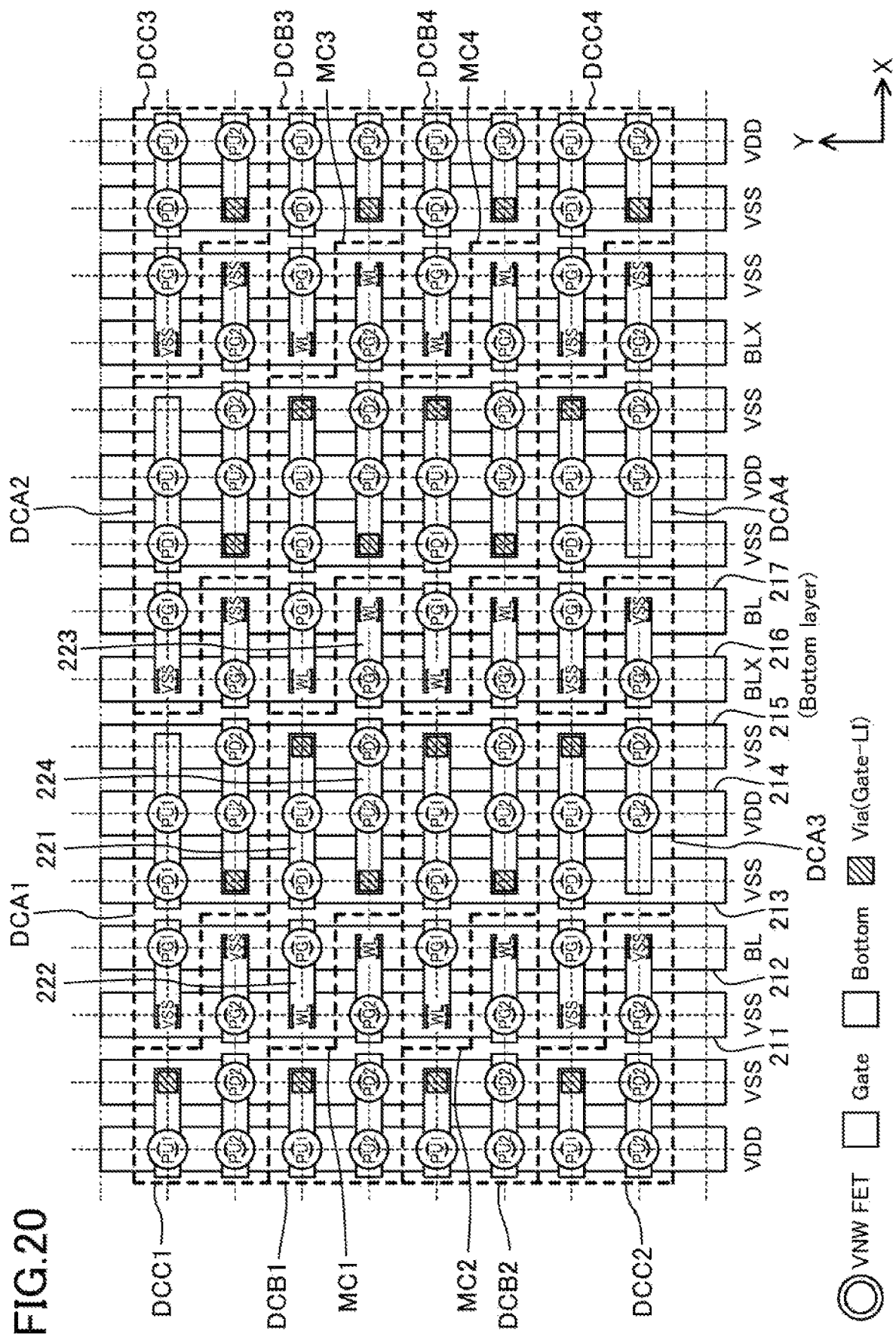
FIG. 20 is a layer-by-layer plan view showing the layout structure of FIG. 19.
Figure 21:
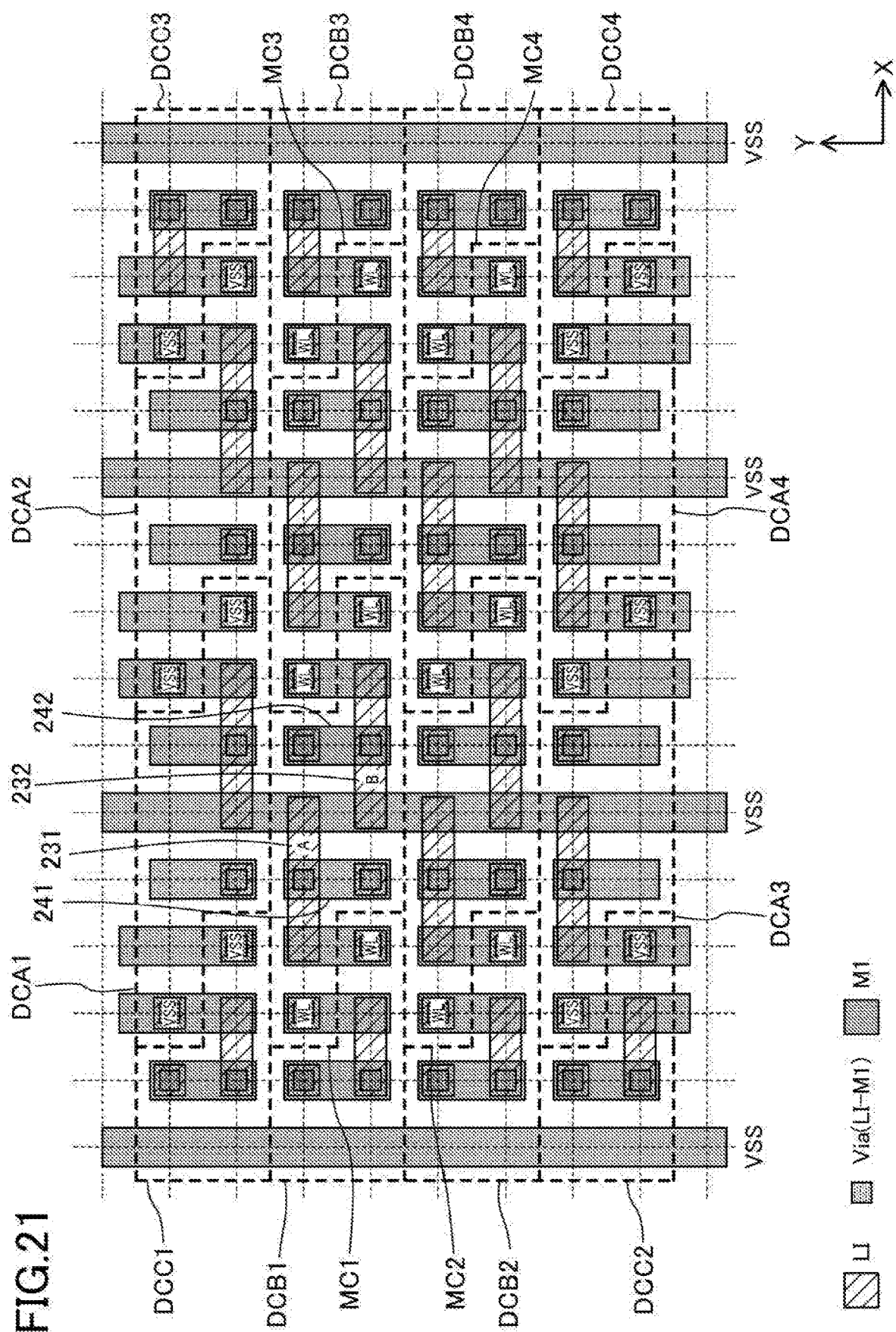
FIG. 21 is a layer-by-layer plan view showing the layout structure of FIG. 19.

FIGS. 19 to 21 are views showing an example of a layout structure of memory cells according to the second embodiment. FIG. 19 is an overall plan view, and FIGS. 20 and 21 are layer-by-layer plan views. Specifically, FIG. 20 shows VNW FETs and layers below them, and FIG. 21 shows local interconnects and M1 interconnects.

FIGS. 19 to 21 show the layout of four adjacently placed memory cells MC1, MC2, MC3, and MC4 and the periphery thereof. The memory cell according to this embodiment implements a 6 T type one-port memory cell shown in FIG. 8A, as in the first embodiment. For convenience of description, it is herein assumed that the memory cell array is constituted by four memory cells MC1, MC2, MC3, and MC4 and that dummy memory cells are placed around the memory cell array. Dummy memory cells DCA1 to DCA4 are placed on the upper and lower sides (both sides in the Y direction) of the memory cell array. Dummy memory cells DCB1 to DCB4 are placed on the left and right sides (both sides in the X direction) of the memory cell array. Dummy memory cells DCC1 to DCC4 are placed at the four corners of the memory cell array.

In this embodiment, none of the structures of the memory cells MC1 to MC4 is inverted. That is, the memory cells MC1 to MC4 have the same layout including the orientation in which the transistors PU1, PU2, PD1, PD2, PG1, and PG2 line up. The dummy memory cells placed around the memory cell array have their layouts conforming to the placement of the memory cells MC1 to MC4. The layout structure is however substantially the same as that of the first embodiment except that the structures of the memory cells MC1 to MC4 are not inverted. In this embodiment, therefore, layer-by-layer plan views for layers of the M2 interconnects and above and cross-sectional views are omitted.

Taking the memory cell MC1 as an example, the layout structure will be described hereinafter in detail. Note however that description may be omitted for a structure similar to that in the first embodiment.

The transistors PU1, PU2, PD1, PD2, PG1, and PG2 are VNW FETs and each have one VNW. The transistors PU1, PD1, and PG1 are arranged in a line in the X direction, and the transistors PU2, PD2, and PG2 are arranged in a line in the X direction. The transistors PD1 and PG1 lie side by side in this order on the left side (corresponding to the first-hand side in the X direction) of the transistor PU1, and the transistors PD2 and PG2 lie side by side in this order on the right side (corresponding to the second-hand side in the X direction) of the transistor PU2. The transistors PU1 and PU2 are placed side by side in the Y direction. An n-well (not shown) is formed under the p-type transistors PU1 and PU2, and a p-substrate is, or a p-well is formed, under the n-type transistors PG1, PG2, PD1, and PD2.

Bottom interconnects 211, 212, 213, 214, 215, 216, and 217 are formed, which extend in the Y direction over the entire memory cell array. The bottom interconnects 211, 213, and 215 supply the power supply voltage VSS, and the bottom interconnect 214 supplies the power supply voltage VDD. The bottom interconnect 212 is a bit line BL connected to the memory cells MC1 and MC2, and the bottom interconnect 216 is an inverted bit line BLX connected to the memory cells MC1 and MC2. The bottom interconnect 217 is a bit line BL connected to the memory cells MC3 and MC4.

The bottoms of the transistors PU1 and PU2 are connected to the bottom interconnect 214 that supplies the power supply voltage VDD. The bottom of the transistor PD1 is connected to the bottom interconnect 213 that supplies the power supply voltage VSS. The bottom of the transistor PG1 is connected to the bottom interconnect 212 that is a bit line BL. The bottom of the transistor PD2 is connected to the bottom interconnect 215 that supplies the power supply voltage VSS. The bottom of the transistor PG2 is connected to the bottom interconnect 216 that is an inverted bit line BL.

The gates of the transistors PU1 and PD1 are mutually connected through a gate interconnect 221 extending in the X direction. The gate interconnect 221 is drawn from the gate of the transistor PU1 rightward in the X direction as viewed from the figure. A gate interconnect 222 is drawn from the gate of the transistor PG1 leftward in the X direction as viewed from the figure. A gate interconnect 223 is drawn from the gate of the transistor PG2 rightward in the X direction as viewed from the figure. The gates of the transistors PU2 and PD2 are mutually connected through a gate interconnect 224 extending in the X direction. The gate interconnect 224 is drawn from the gate of the transistor PU2 leftward in the X direction as viewed from the figure.

The tops of the transistors PU1, PD1, and PG1 are connected to a local interconnect 231 extending in the X direction. The local interconnect 231 is connected with the gate interconnect 224 via an M1 interconnect 241. That is, the tops of the transistors PU1, PD1, and PG1 are connected with the gates of the transistors PU2 and PD2 through the local interconnect 231, the M1 interconnect 241, and the gate interconnect 224. The local interconnect 231, the M1 interconnect 241, and the gate interconnect 224 correspond to the memory node A. The local interconnect 231 is an example of the first signal interconnect, and the M1 interconnect 241 is an example of the first connection interconnect.

The tops of the transistors PU2, PD2, and PG2 are connected to a local interconnect 232 extending in the X direction. The local interconnect 232 is connected with the gate interconnect 221 via an M1 interconnect 242. That is, the tops of the transistors PU2, PD2, and PG2 are connected with the gates of the transistors PU1 and PD1 through the local interconnect 232, the M1 interconnect 242, and the gate interconnect 221. The local interconnect 232, the M1 interconnect 242, and the gate interconnect 221 correspond to the memory node B. The local interconnect 232 is an example of the second signal interconnect, and the M1 interconnect 242 is an example of the second connection interconnect.

An M2 interconnect 251 that is a word line WL extends in the X direction, and is connected with the gate interconnect 222 through an M1 interconnect extending in the Y direction, a local interconnect, and vias. The M2 interconnect 251 is also connected with the gate interconnect 223 through an M1 interconnect extending in the Y direction, a local interconnect, and vias. That is, the gates of the transistors PG1 and PG2 are connected to the M2 interconnect 251, i.e., the word line WL.

M2 interconnects 252 and 253 that supply the power supply voltage VSS extend in the X direction to overlap the memory cell MC1 as viewed from top, but are not directly connected with the memory cell MC1.

M3 interconnects 261, 262, 263, 264, 265, 266, and 267 are formed, which extend in the Y direction over the entire memory cell array. The M3 interconnect 263 is a bit line BL connected to the memory cells MC1 and MC2, and the M3 interconnect 265 is an inverted bit line BLX connected to the memory cells MC1 and MC2. The M3 interconnects 263 and 265 are not directly connected with the memory cell MC1. As will be described later, however, in a tap cell, the M3 interconnect 263 is connected with the bottom interconnect 212 that corresponds to the bit line BL, and the M3 interconnect 265 is connected with the bottom interconnect 216 that corresponds to the inverted bit line BLX. The placement position of the M3 interconnect 263 is not the same as that of the bottom interconnect 212, but is displaced from that of the bottom interconnect 212 rightward by one grid as viewed from the figure. Also, the placement position of the M3 interconnect 265 is not the same as that of the bottom interconnect 216, but is displaced from that of the bottom interconnect 216 leftward by one grid as viewed from the figure.

The M3 interconnects 261, 262, 266, and 267 supply the power supply voltage VSS, and the M3 interconnect 264 supplies the power supply voltage VDD. The M3 interconnects 261, 262, 266, and 267 and the M3 interconnect 264, however, are not directly connected with the memory cell MC1.

In the SRAM cell according to this embodiment, the arrangement of the transistors PU1, PU2, PD1, PD2, PG1, and PG2 constituting the SRAM cell is highly symmetric. Therefore, since any asymmetric property in device characteristics is prevented or reduced, it is possible to improve the device characteristics, enhance the reliability of the semiconductor integrated circuit device, and enhance the yield.

The bottom interconnects extend in the Y direction, and have the same interconnect width and a fixed interconnect pitch. The gate interconnects extend in the X direction, and have the same interconnect width and a fixed interconnect pitch. The local interconnects extend in the X direction, and have the same interconnect width and a fixed interconnect pitch. The M1 interconnects extend in the Y direction, and have the same interconnect width and a fixed interconnect pitch. The M2 interconnects extend in the X direction, and have the same interconnect width and a fixed interconnect pitch. The M3 interconnects extend in the Y direction, and have the same interconnect width and a fixed interconnect pitch.

Therefore, the fabrication precision of the semiconductor integrated circuit device improves, whereby variations in device characteristics are prevented or reduced. Note that all of the interconnects in the layers are not necessarily required to be the same in direction, interconnect width, or interconnect pitch.

(Layout of Tap Cell)

Figure 22:
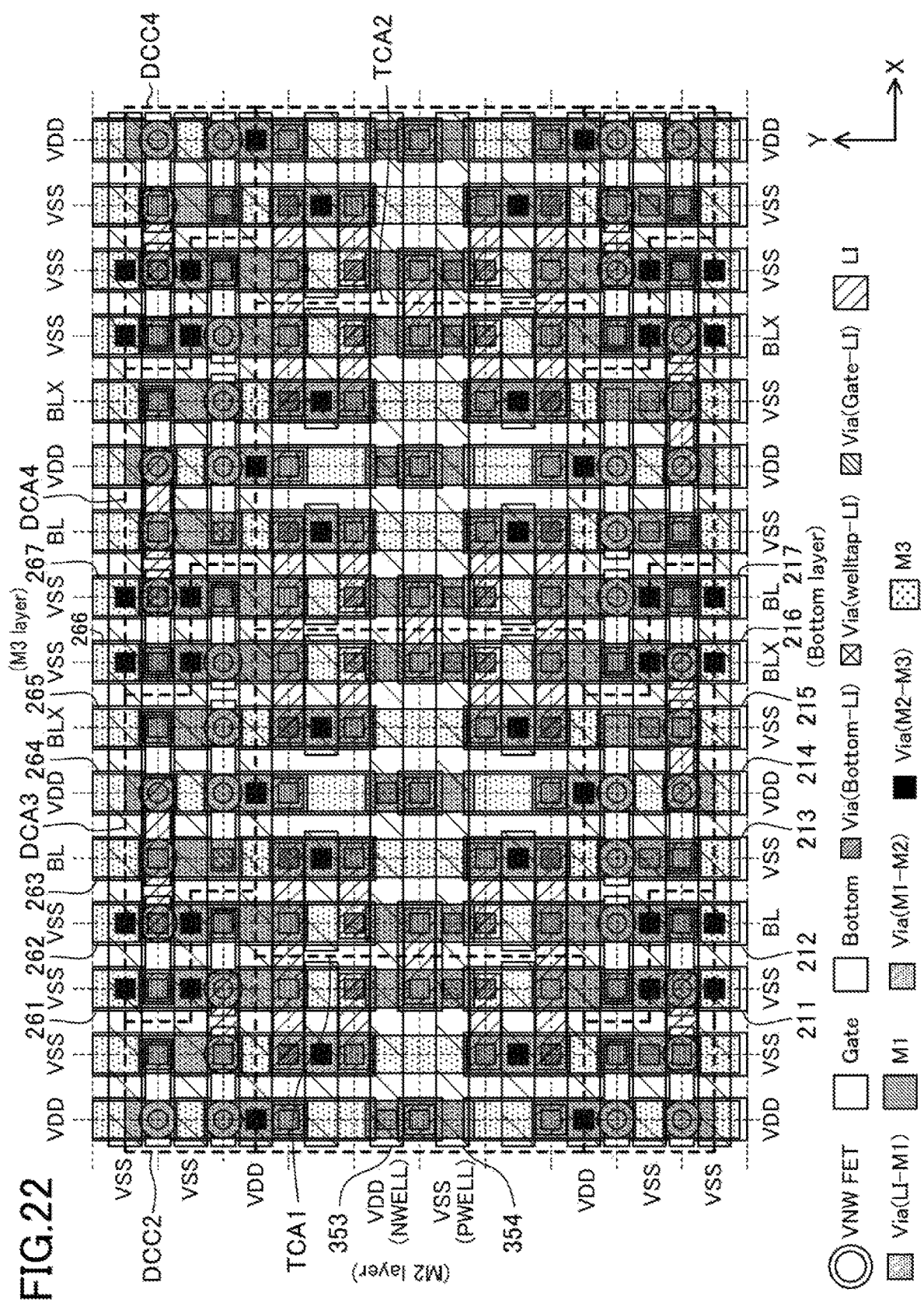
FIG. 22 is a plan view showing an example of a layout structure of tap cells in the second embodiment.
Figure 23:
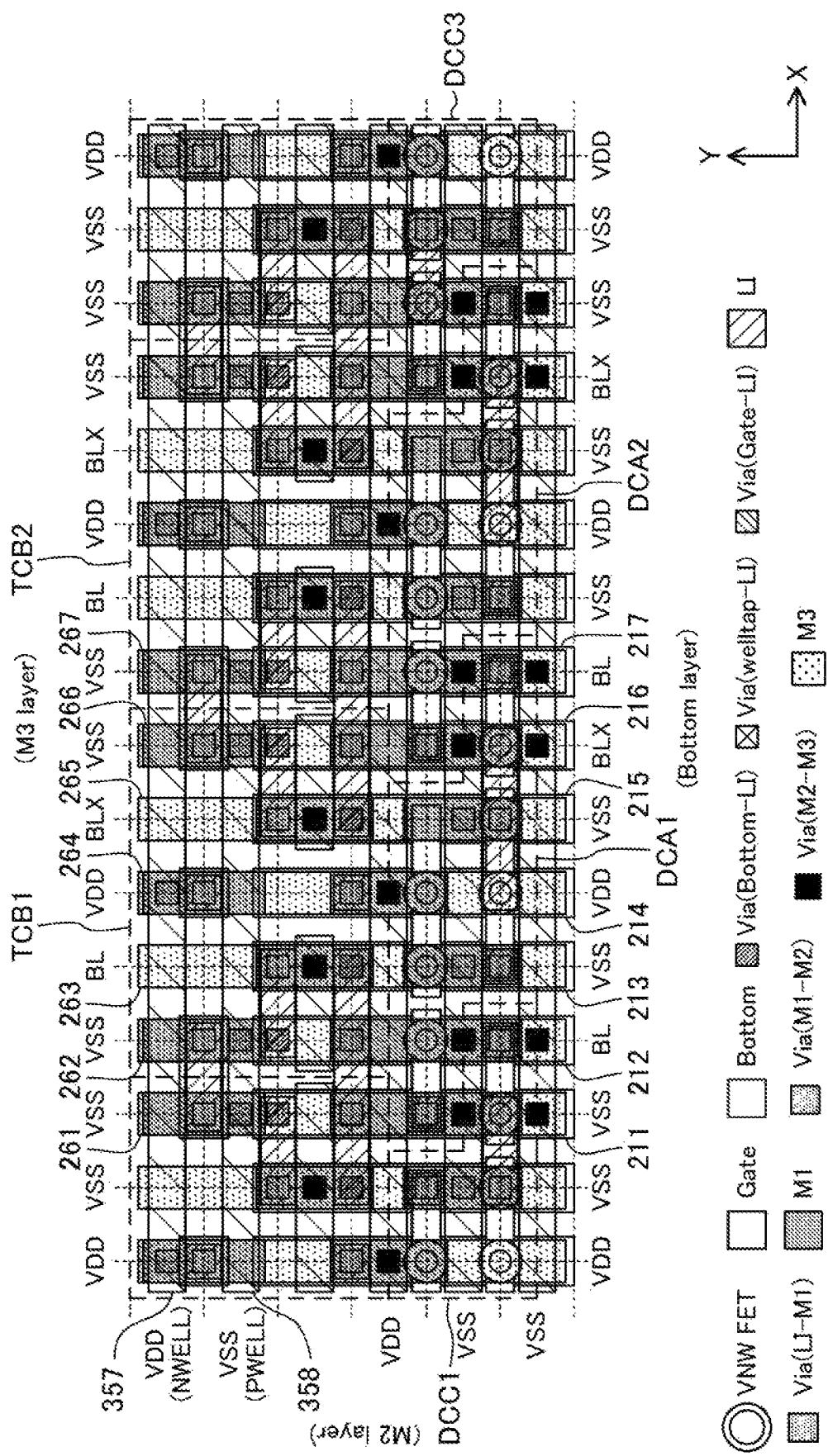
FIG. 23 is a plan view showing an example of a layout structure of tap cells in the second embodiment.

FIGS. 22 and 23 are overall plan views showing examples of layout configurations of tap cells in this embodiment. Note that layer-by-layer plan views are omitted in this embodiment because the layout structures to be described hereinafter are substantially similar to those in the first embodiment.

FIG. 22 shows adjacently placed tap cells TCA1 and TCA2 and the periphery thereof. The tap cell TCA1 is placed at a position lining up with the memory cells MC1 and MC2 in the Y direction, and the tap cell TCA2 is placed at a position lining up with the memory cells MC3 and MC4 in the Y direction. The aforementioned dummy memory cells DCA3 and DCA4 lie on the upper side of the tap cells TCA1 and TCA2 as viewed from the figure.

An M2 interconnect 353 that supplies the power supply voltage VDD and an M2 interconnect 354 that supplies the power supply voltage VSS extend in the X direction. The M2 interconnect 353 supplies the power supply voltage VDD to an n-well through an M1 interconnect and a bottom region. The M2 interconnect 354 supplies the power supply voltage VSS to the p-substrate or a p-well through an M1 interconnect and a bottom region.

FIG. 23 shows adjacently placed tap cells TCB1 and TCB2 and the periphery thereof. The tap cell TCB1 is placed at a position lining up with the memory cells MC1 and MC2 in the Y direction, and the tap cell TCB2 is placed at a position lining up with the memory cells MC3 and MC4 in the Y direction. The aforementioned dummy memory cells DCA1 and DCA2 lie on the lower side of the tap cells TCB1 and TCB2 as viewed from the figure.

An M2 interconnect 357 that supplies the power supply voltage VDD and an M2 interconnect 358 that supplies the power supply voltage VSS extend in the X direction. The M2 interconnect 357 supplies the power supply voltage VDD to an n-well through an M1 interconnect and a bottom region. The M2 interconnect 358 supplies the power supply voltage VSS to the p-substrate or a p-well through an M1 interconnect and a bottom region.

The other configurations are similar to those in the first embodiment, and therefore detailed description thereof is omitted here. Having the tap cells according to this embodiment, functions and effects similar to those in the first embodiment are obtained.

That is, the tap cells TCA1 and TCB1 electrically connect the bottom interconnect 212 and the M3 interconnect 263 that are both bit lines BL and electrically connect the bottom interconnect 216 and the M3 interconnect 265 that are both inverted bit lines BLX. In this way, by providing the bit line pair BL/BLX in the M3 interconnect layer and connecting this bit line pair with the bit line pair BL/BLX of the bottom interconnects in the tap cells, reduction in the resistance of the bit line pair BL/BLX can be realized.

Also, with the bit line connection by the tap cells TCA1 and TCB1, the positions of the bit lines BL in the bottom layer and the M3 interconnect layer are displaced from each other, and also the positions of the inverted bit lines BLX in these layers are displaced from each other. By this placement, the bit line BL and the inverted bit line BLX are avoided from being adjacent to each other in the M3 interconnect layer, and thus noise due to crosstalk is suppressed.

Other Embodiments (No. 1)

While the planar shape of the VNWs is a circle in the layout structure examples described above, it is not limited to a circle. For example, the planar shape of the VNWs can be a rectangle or an oval. When the planar shape is an oval, for example, the area of the VNWs per unit area will be larger, allowing a larger amount of current to flow to the transistors and thus permitting speedup of the semiconductor integrated circuit device.

When the planar shape of the VNWs is a shape extending long in one direction like an oval, the direction of the extension is preferably uniform. Also, the positions of the ends are preferably aligned.

In an SRAM cells, all VNWs are not necessarily required to have the same shape, but VNWs having different planar shapes may be present in a mixed manner. For example, circular VNWs and oval VNWs may be present in a mixed manner.

While one transistor is constituted by one VNW in the embodiments described above, one transistor may be constituted by a plurality of VNWs.

(No. 2)

In the above embodiments, the bit line connecting portion in a tap cell serves to displace the positions of both the bit line BL and the inverted bit line BLX in the bottom layer from those in the M3 interconnect layer. Instead, the bit line connecting portion in the tap cell may be configured to displace the position of either one of the bit line BL and the inverted bit line BLX. Alternatively, the bit line connecting portion in the tap cell may be configured not to displace the position of either the bit line BL or the inverted bit line BLX.

The bit line connecting portion described above may be provided in the circuit block separately from the tap cell. That is, The tap cells TCA1 and TCB1 described in the first and second embodiments are examples of the array peripheral part provided with the bit line connecting portion that connects the bit line pair of the bottom interconnects and the bit line pair of the M3 interconnects.

While the bit lines BL and the inverted bit lines BLX are formed in the M3 interconnect layer in the above embodiments as an example, they may be formed in another metal interconnect layer.

According to the present disclosure, for an SRAM cell using VNW FETs, a layout having a highly symmetric transistor arrangement is implemented. The present disclosure is therefore useful for improvement of the performance of a semiconductor chip, for example.

What is claimed is:
1. A semiconductor integrated circuit device provided with a static random access memory (SRAM) cell,
wherein
the SRAM cell includes
a first memory node,
a second memory node,
a first transistor of a first conductivity type provided between a high voltage-side power supply line and the first memory node,
a second transistor of a second conductivity type provided between a low voltage-side power supply line and the first memory node,
a third transistor of the first conductivity type provided between the high voltage-side power supply line and the second memory node,
a fourth transistor of the second conductivity type provided between the low voltage-side power supply line and the second memory node,
a fifth transistor of the second conductivity type provided between a bit line and the first memory node, a gate of the fifth transistor being connected with a word line, and
a sixth transistor of the second conductivity type provided between an inverted bit line and the second memory node, a gate of the sixth transistor being connected with the word line, gates of the first and second transistors are mutually connected and also connected with the second memory node, gates of the third and fourth transistors are mutually connected and also connected with the first memory node, the first to sixth transistors are vertical nanowire (VNW) FETs, the second and fifth transistors are placed side by side sequentially on a first-hand side in a first direction of the first transistor, the fourth and sixth transistors are placed side by side sequentially on a second-hand side in the first direction of the third transistor, the second-hand side being the side opposite to the first-hand side, and the first and third transistors are placed side by side in a second direction vertical to the first direction.

2. The semiconductor integrated circuit device of claim 1, wherein the SRAM cell includes
a first signal interconnect that extends in the first direction and is connected with top electrodes of the first, second, and fifth transistors, and
a second signal interconnect that extends in the first direction and is connected with top electrodes of the third, fourth, and sixth transistors.

3. The semiconductor integrated circuit device of claim 2, wherein the SRAM cell includes
a first gate interconnect that extends in the first direction, is connected with the gates of the first and second transistors, and is drawn from the second-hand side of the first transistor, and
a second gate interconnect that extends in the first direction, is connected with the gates of the third and fourth transistors, and is drawn from the first-hand side of the third transistor,
the first signal interconnect is electrically connected with the second gate interconnect through a first connection interconnect extending in the second direction, and
the second signal interconnect is electrically connected with the first gate interconnect through a second connection interconnect extending in the second direction.

4. The semiconductor integrated circuit device of claim 1, wherein the SRAM cell includes
a first bottom interconnect that extends in the second direction, overlaps the first and third transistors as viewed from top, and is connected with bottom electrodes of the first and third transistors.

5. A semiconductor integrated circuit device provided with static random access memory (SRAM) cells using vertical nanowire (VNW) FETs, comprising:

a memory cell array having the SRAM cells arranged in an array in a first direction and in a second direction vertical to the first direction;

bit lines and inverted bit lines that extend in the second direction and are connected with the memory cell array; and an array peripheral part lying on either of the sides of the memory cell array in the second direction and overlapping the bit lines and the inverted bit lines as viewed from top, wherein the bit lines include a first bottom interconnect and a first metal interconnect formed in a metal layer, the inverted bit lines include a second bottom interconnect and a second metal interconnect formed in the metal layer, the first and second bottom interconnects and the first and second metal interconnects extend in the second direction over a plurality of SRAM cells arranged in the second direction, out of the SRAM cells, the array peripheral part includes
a bit line connecting portion that electrically connects the first bottom interconnect and the first metal interconnect and electrically connects the second bottom interconnect and the second metal interconnect, at least either the first bottom interconnect and the first metal interconnect or the second bottom interconnect and the second metal interconnect are different in position in the first direction from each other, and the bit line connecting portion includes a connection interconnect extending in the first direction that electrically connects the first bottom interconnect and the first metal interconnect mutually and/or the second bottom interconnect and the second metal interconnect mutually, which are different in position in the first direction.

* * * * *